United States Patent [19]
Girard et al.

[11] Patent Number: 6,146,813
[45] Date of Patent: Nov. 14, 2000

[54] METHOD AND SHUNTING AND DESHUNTING AN ELECTRICAL COMPONENT AND A SHUNTABLE/ SHUNTED ELECTRICAL COMPONENT

[75] Inventors: Mark T. Girard, South Haven; Ryan A. Jurgenson, Hutchinson, both of Minn.

[73] Assignee: Applied Kinetics Inc., Hutchinson, Minn.

[21] Appl. No.: 09/273,661

[22] Filed: Mar. 23, 1999

Related U.S. Application Data

[60] Provisional application No. 60/115,754, Jan. 13, 1999.

[51] Int. Cl.$^7$ ...................................................... G11B 5/11
[52] U.S. Cl. ........................... 430/319; 430/311; 430/945; 29/603.03; 29/603.07; 360/245.8; 219/121.85
[58] Field of Search ............................ 29/603.03, 603.07; 360/128, 323, 245.8; 219/121.69, 121.85, 121.72; 430/311, 319, 945

[56] References Cited

U.S. PATENT DOCUMENTS

| | | | |
|---|---|---|---|
| 4,691,091 | 9/1987 | Lyons et al. | 219/121 |
| 5,182,230 | 1/1993 | Donelon et al. | 437/173 |
| 5,463,242 | 10/1995 | Castleberry | 257/448 |
| 5,465,186 | 11/1995 | Bajorek et al. | 360/113 |
| 5,491,605 | 2/1996 | Hughbanks et al. | 360/113 |
| 5,638,237 | 6/1997 | Phipps et al. | 360/128 |
| 5,644,454 | 7/1997 | Arya et al. | 360/106 |
| 5,699,212 | 12/1997 | Erpelding et al. | 360/104 |
| 5,759,428 | 6/1998 | Balamane et al. | 219/121.66 |
| 5,812,349 | 9/1998 | Shouji et al. | 360/110 |
| 5,812,357 | 9/1998 | Johansen et al. | 361/212 |

OTHER PUBLICATIONS

H.M. Phillips, T. Feurer, S. P. LeBlanc, D.L. Callahan and R. Sauerbrey,m "Excimer Laser Induced Permanent Electrical Conductivity and Nanostructures in Polymers", Sep. 1993, published in SPIE vol. 1856 Laser Radiation Photophysics (1993), pp. 143–154.

H.M. Phillips, Yunjun Li, and Binglin Zhang, "Laser Induced Permanent Electrical Conductivity in Insulating Metal–Polymer Composites", Apr. 1996, published in SPIE vol. 2888, pp. 404–413.

*Primary Examiner*—John A. McPherson
*Attorney, Agent, or Firm*—Briggs and Morgan; Craig Gregersen

[57] ABSTRACT

The present invention provides a method for the creation and removal of shunts for the prevention of ESD/EOS damage to electrical components. In one embodiment of the present invention, the conductive pathway is provided and removed by exposing the interconnect's carbonizable and ablatable substrate to a radiant energy source such as a laser beam. The present invention also provides for interconnects that include at least two conductive wires or leads engaged on at least one surface by a carbonizable and ablatable material. The conductive wires may each include a branched dead end lead portion interleaved with the branched dead end lead portion of the other. Alternatively, the conductive wires may extend in close proximity to each other in a curved or sinuous or serpentine or backtracking pattern. An interconnect in accord with the present invention may include a substrate substantially supporting the conductive wires except at predetermined locations or proposed shunt sites wherein there is at least one through hole in the substrate.

65 Claims, 20 Drawing Sheets

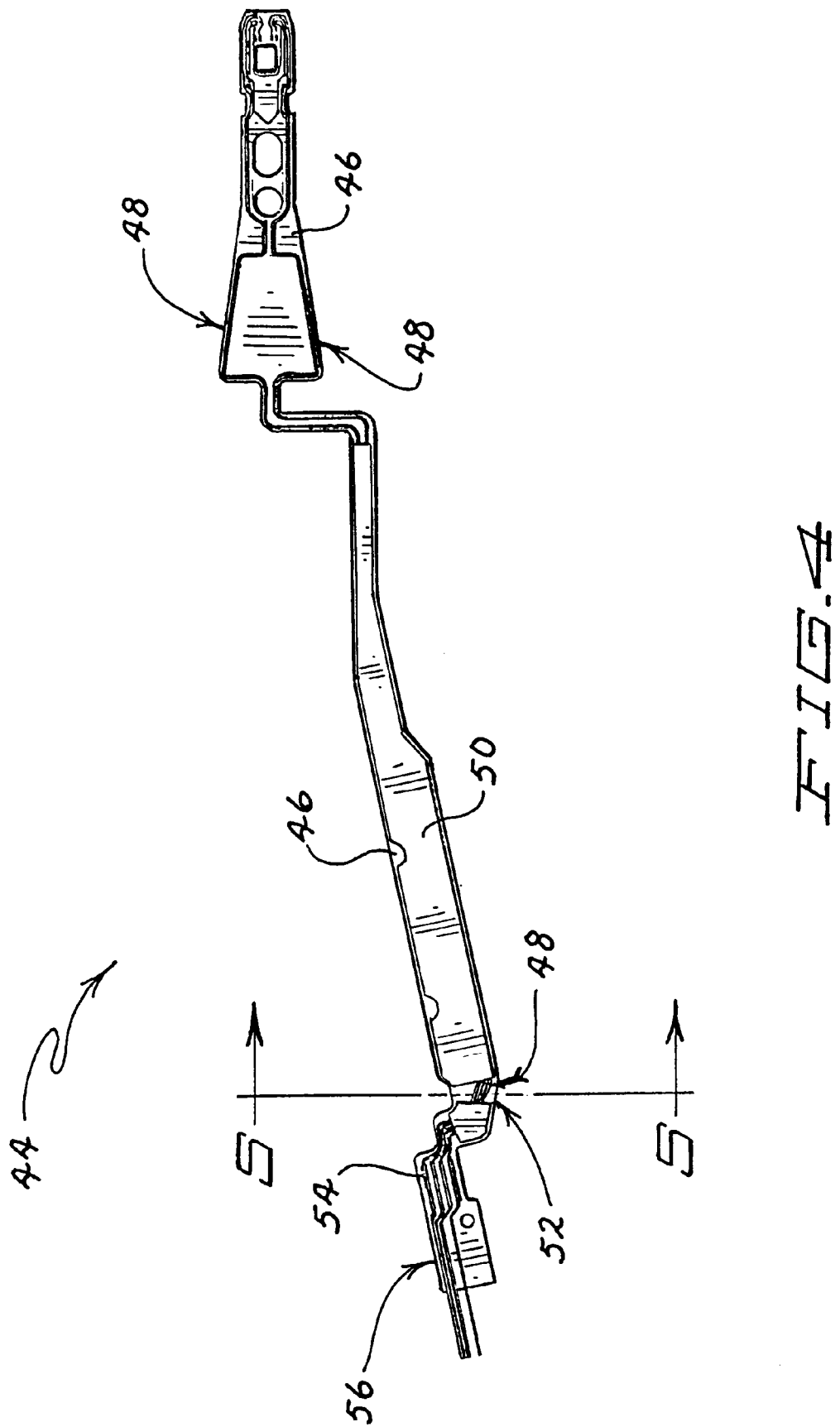

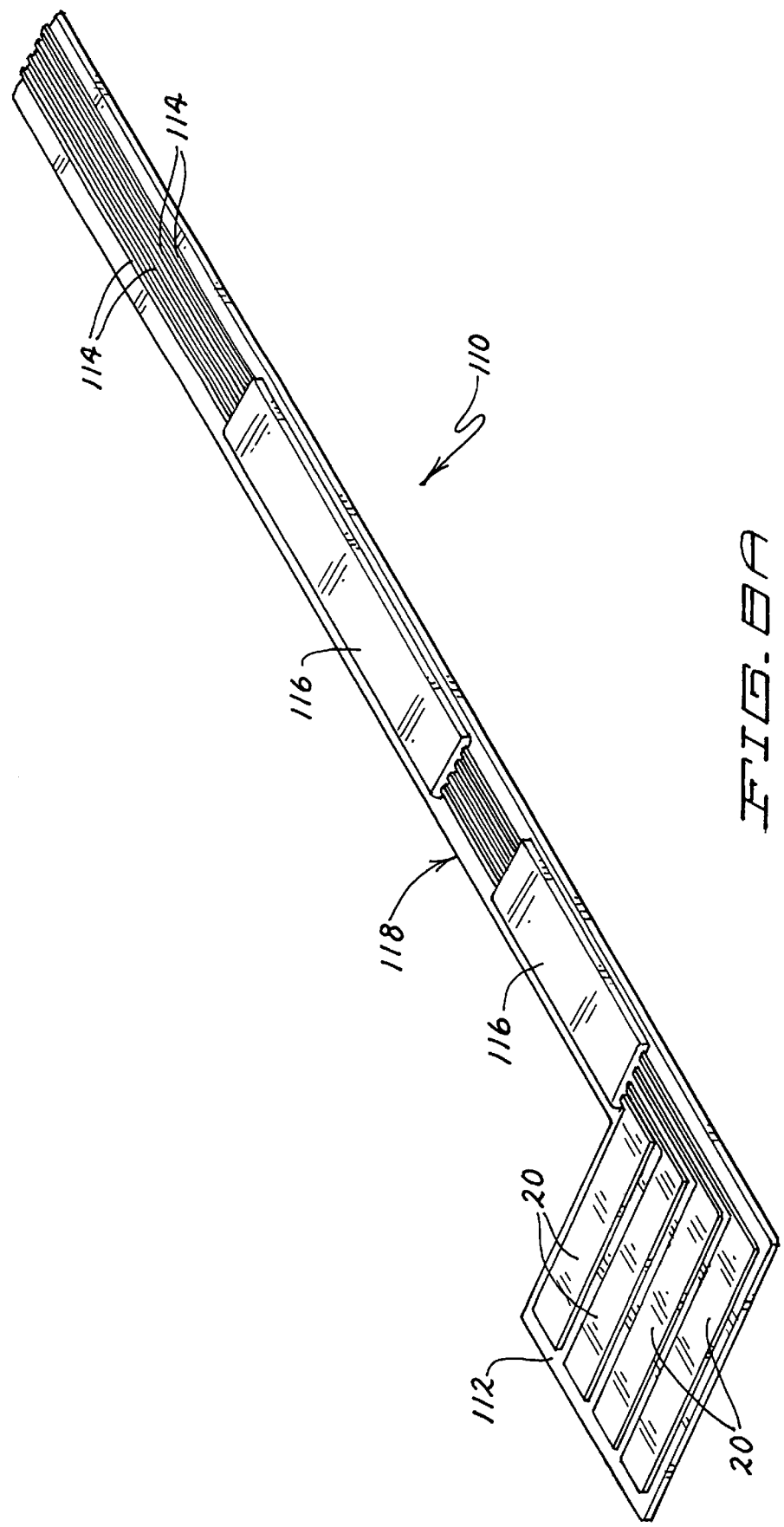

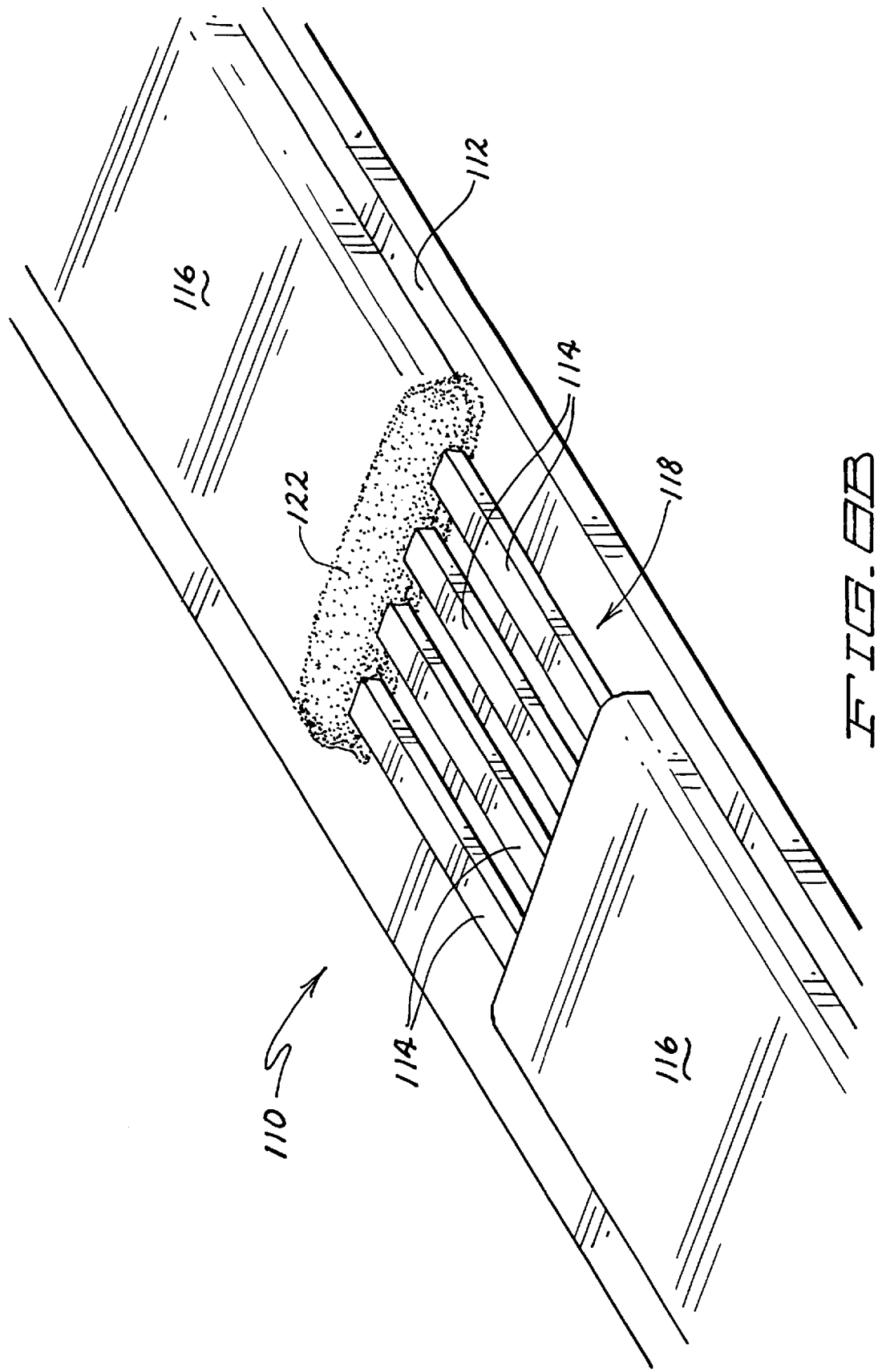

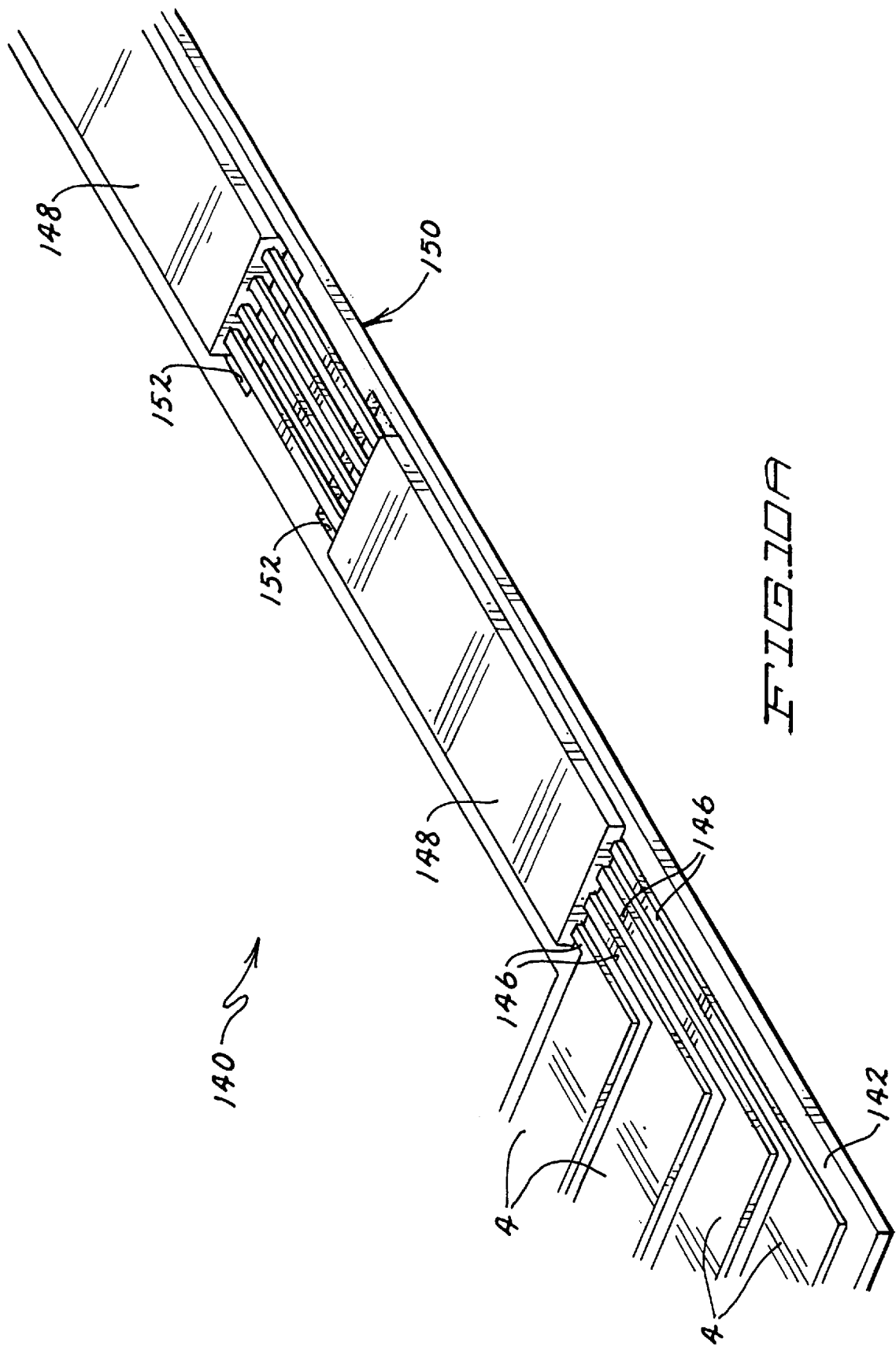

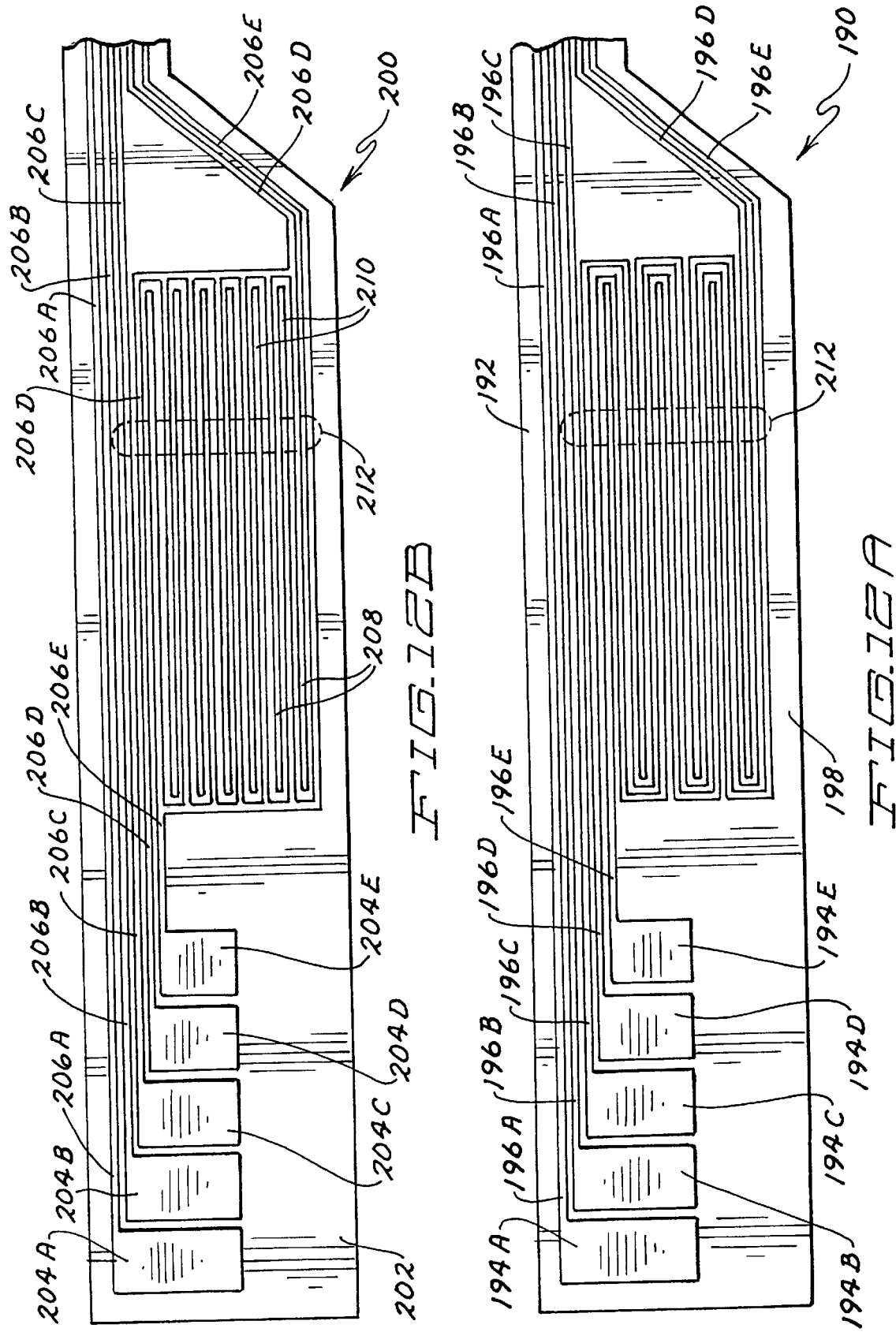

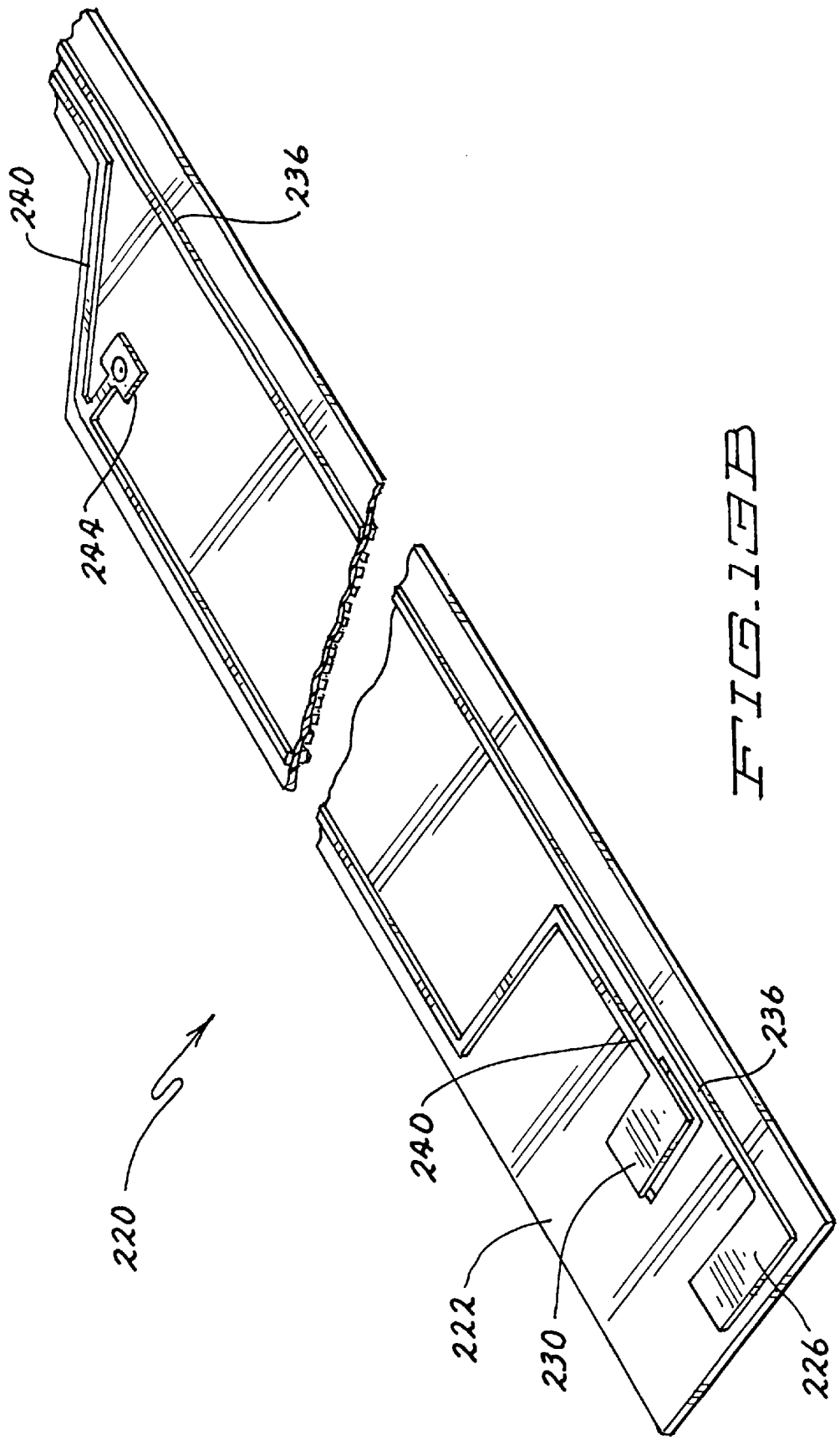

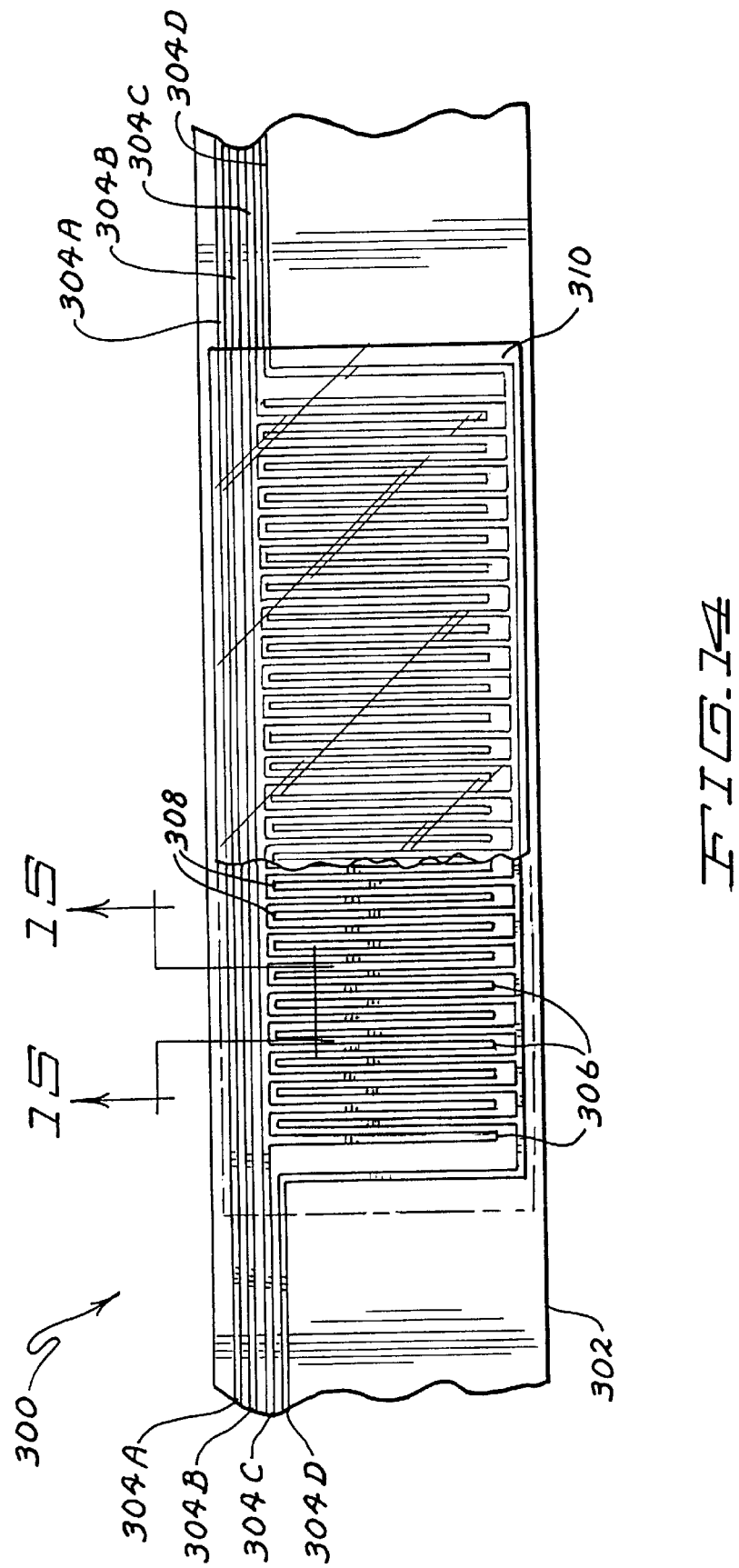

METHOD AND SHUNTING AND DESHUNTING AN ELECTRICAL COMPONENT AND A SHUNTABLE/SHUNTED ELECTRICAL COMPONENT

This application claims the benefit of U.S. Provisional Application No. 60/115,754, filed Jan. 13, 1999.

FIELD OF THE INVENTION

The present invention relates generally to methods for eliminating or reducing potential damage to devices from electrostatic discharge or electrical overstress and to such devices, and particularly to methods for reducing such damage to electronic components such as but not limited to a magnetoresistive head forming part of a hard disk drive.

BACKGROUND OF THE PRESENT INVENTION

Damage due to electrostatic discharge (ESD) and/or electrical overstress (EOS) costs industry uncounted and perhaps uncountable dollars daily in damaged and irreparable goods. More specifically, ESD/EOS damage is a particular problem in the electronics industry where the components are, of course, designed to conduct electricity in the first instance and where their continuously shrinking size renders them increasingly susceptible to such damaging effects. Generally, ESD refers to actual discharges while EOS refers to the effects of such discharges or currents induced by such discharges or other electrical or magnetic fields. For present purposes, reference to one should be interpreted to include the other.

ESD, familiarly manifested by the lightning bolts or by the shock received when touching a door knob, after walking across a carpet, can range from a few volts to as much as several thousand volts, resulting in extremely large transient currents. As electronic components shrink in size they become ever more susceptible to damage from smaller and small voltages and current.

ESD can arise in several different ways, most commonly as a result of triboelectric charging or induction. Triboelectric charging causes a charge build up due to the frictional engagement of two objects. That is, static charge builds up as a result of a series of contacts and separations of two objects. Electrons travel from one object to the other during these contacts depending on the relative abilities of the objects to gain or lose electrons, that is, depending upon the position of the two objects in the electrochemical potential series. Consequently, a net charge of opposite sign will build up and remain on both of the objects after their separation. Where the object has good conductivity and is grounded, charge will flow to the ground. If the electric field generated by the separated charges is strong enough, an electrostatic discharge can occur in form of a spark traveling across an air gap from one object towards an object at a lower electrostatic potential, thus providing the familiar blue light generated by the spark. This discharge can occur either as one object is brought next to one of the charged objects or as one object is separated from the other.

Static charges can also build up by induction. That is, if a charged object is brought near an uncharged object, the electric field of the charged object will induce a charge in the object, generating an electric field and potentially a static discharge.

A goal in many industries, then, is to determine methods and apparatus for reducing or eliminating static discharges. One of the electronics industries affected by ESD/EOS damage is that which manufactures and assembles computer hard disk drives. As noted above, present hard disk drives include a disk rotated at high speeds and a read/write head that, in industry parlance, "flies" a microscopic distance above the disk surface. The disk includes a magnetic coating that is selectively magnetizable. As the head flies over the disk, it "writes" information, that is, data, to the hard disk drive by selectively magnetizing small areas of the disk; in turn, the head "reads" the data written to the disk by sensing the previously written selective magnetizations. The read/write head is affixed to the drive by a suspension assembly and electrically connected to the drive electronics by an electrical interconnect. This structure (suspension, electrical interconnect, and read/write head) is commonly referred to in the industry as a Head Gimbal Assembly, or HGA.

More specifically, currently manufactured and sold read/write heads include an inductive write head and a magnetoresistive (MR) read head or element or a "giant" magnetoresistive (GMR) element to read data that is stored on the magnetic media of the disk. The write head writes data to the disk by converting an electric signal into a magnetic field and then applying the magnetic field to the disk to magnetize it. The MR read head reads the data on the disk as it flies above it by sensing the changes in the magnetization of the disk as changes in the voltage or current of a current passing through the MR head. This fluctuating voltage in turn is converted into data. The read/write head, along with a slider, is disposed at the distal end of an electrical interconnect/suspension assembly.

Other types or read heads, such as inductive read heads, are known, but the MR and GMR elements enable the reading of data that is stored more densely than that which was allowed with the use of inductive read element technology. MR and GMR read elements are much more sensitive to current transients resulting from voltage potentials and thermal gradients, however, than the previous read element technologies. It is now becoming increasingly necessary to manage environmental electrostatic charge levels to as low 3.3 volts during HGA manufacturing processes so as not to damage the MR and GMR elements. Failing to do so, or failing to provide an avenue for the safe discharge of the accumulated electrostatic charge can result in damage to the MR and GMR heads.

Damage to an MR or GMR head can be manifested as physical damage or magnetic damage. In the former, melting of the read element in the head can occur because of the heat generated by the transient current of the discharge. Magnetic damage can occur in the form of loss of sensing ability and instability. Furthermore, direct discharge into the head is not necessary to create the damage. Damaging current flows in the head can also reportedly be created through electromagnetic interference as a result of a distant (relatively speaking) discharge.

An exploded view of a typical electrical interconnect/suspension assembly is shown in FIG. 1, which illustrates several components including a suspension A and an interconnect B. It will be understood that the actual physical structures of these components may vary in configuration depending upon the particular disk drive manufacturer and that the assembly shown in FIG. 1 is meant to be illustrative of the prior art only. Typically, the suspension A will include a base plate C, a radius (spring region) D, a load beam E, and a gimbal F. At least one tooling aperture G may be included. An interconnect B may include a base H, which may be a synthetic material such as a polyimide, that supports typically a plurality of electrical traces or leads I of the interconnect. The electrical interconnect B may also include a polymeric cover layer that encapsulates selected areas of the electrical traces or leads I.

Stated otherwise, suspension A is essentially a stainless steel support structure that is secured to an armature in the disk drive. The read/write head is attached to the tip of the suspension A with adhesive or some other means. The aforementioned electrical interconnect is terminated to bond pads on the read/write head and forms an electrical path between the drive electronics and the read and write elements in the read/write head. The electrical interconnect is typically comprised of individual electrical conductors supported by an insulating layer of polyimide and typically covered by a cover layer. Prior to the time that the HGA is installed into a disk drive, the electrical interconnect is electrically connected to the read and write elements, but is not connected to the drive electronics. As a result, the individual conductors that make up the electrical interconnect, can easily be charged by stray voltages, thereby creating a voltage potential across the sensitive MR or GMR read elements, which when discharged results in damaging current transients through the read element.

The components shown in FIG. 1 as well as all those associated with hard disk drives are small and continually decreasing in size. Consequently, any tolerance for ESD/EOS damage of the components during the assembly process is also continuously decreasing while their susceptibility to damage during assembly is increasing.

As noted, an ESD can actually damage or destroy circuit pathways in small electronic parts, such as an MR head, requiring the head to be discarded. The industry has been so concerned about this costly manufacturing problem that numerous patents have issued addressing the problem, including but not limited to U.S. Pat. Nos. 5,867,888 for Magnetic Head/Silicon Chip Integration Method; 5,855,301 for Electrostatic Grounding System for a Manually Operated Fluid Dispenser; 5,843,537 for Insulator Cure Process for Giant Magnetoresistive Heads; 5,837,064 for Electrostatic Discharge Protection of Static Sensitive Devices Cleaned with Carbon Dioxide Spray; 5,812,357 for Electrostatic Discharge Protection Device; 5,812,349 for Magnetic Head Apparatus Including Separation Features; 5,761,009 for Having Parastic [sic] Shield for Electrostatic Discharge Protection; 5,759,428 for Method of Laser Cutting a Metal Line on an Mr Head; 5,757,591 for Magnetoresistive Read/Inductive Write Magnetic Head Assembly; Fabricated with Silicon on Hard Insulator for Improved Durability and Electrostatic Discharge Protection and Method for Manufacturing Same; 5,757,590 for Fusible-Link Removable Shorting of Magnetoresistive Heads for Electrostatic Discharge Protection; 5,748,412 for Method and Apparatus for Protecting Magnetoresistive Sensor Element from Electrostatic Discharge; 5,742,452 for Low Mass Magnetic Recording Head and Suspension; 5,732,464 for Method of Facilitating Installation or Use of an Electromechanical Information-Storage Device Drive Assembly; 5,710,682 for Electrostatic Discharge Protection System for Mr Heads; 5,699,212 for Method of Electrostatic Discharge Protection of Magnetic Heads in a Magnetic Storage System; 5,686,697 for Electrical Circuit Suspension System; 5,654,850 for Carbon Overcoat with Electrically Conductive Adhesive Layer for Magnetic Head Sliders; 5,650,896 for Low Cost Plastic Overmolded Rotary Voice Coil Actuator; 5,644,454 for Electrostatic Discharge Protection System for Mr Heads; 5,638,237 for Fusible-Link Removable Shorting of Magnetoresistive Heads for Electrostatic Discharge Protection; 5,589,777 for Circuit and Method for Testing a Disk Drive Head Assembly Without Probing; 5,491,605 for Shorted Magnetoresistive Head Elements for Electrical Overstress and Electrostatic Discharge Protection; and 5,465,186 for Shorted Magnetoresistive Head Leads for Electrical Overstress and Electrostatic Discharge Protection During Manufacture of a Magnetic Storage System.

The foregoing patents generally evidence four different methods for reducing or eliminating ESD damage to MR heads, each relying upon the minimization of the voltage potential across the read elements or dissipation of the static electric charge—that is, the creation of an electrical short—and not the prevention of its buildup in the first instance. These methods include the use of mechanical clips, solder bridges, conductive tape, or a tear-away or sheared etched electrical shunt that is manufactured into the HGA by vapor deposition and etching or some other process. While each of these methods has met with some success, each has its own particular disadvantages. For example, mechanical clips are relatively expensive and also require a substantial amount of manual labor to attach them to the electrical interconnect; solder bridges arc difficult to attach and then remove without causing damage to sensitive parts, can be a source of contamination in the drive, and also require manual labor for solder application and removal; conductive tape is expensive and requires manual labor for application; and tear away shunts require expensive apparatus, prohibit the electrical interconnect manufacturer from performing badly needed in-process continuity checks on the electrical interconnect, and is intentionally designed as a one-time shunt.

There are disadvantages that are shared by all of the above methods. First, each method is essentially a one-time application of an electrical short. That is, each of these methods relies upon a one-time placement and subsequent removal of the electrical short. Preferred manufacturing and quality testing operations, however, may require the successive application and removal of electrical shorts. For example, prior to in-process read/write head characterization, the electrical interconnect must be de-shunted, and then re-shunted after the head characterization to prevent ESD damage later in the manufacturing process. Yet, as noted, most of the foregoing methods of providing shunts are limited in their ability to be reapplied. This inability to repeatedly create and remove electrical shorts as desired is a critical limitation in present manufacturing operations. In addition, the very act of placing and, particularly, removing the electrical short can cause the very ESD sought to be avoided and, therefore, the damage that the short was to prevent in the first instance.

Further, each of the foregoing methods relies upon a physical engagement with the critical components of the MR head with at least one and sometimes two or more physical contacts, at least with the shunt itself and also, depending upon the shunting method used, with the tool applying the electrical shunt itself to the head. Each of these engagements and disengagements carries with it the potential for damaging the head.

Broadly stated, it would be desirable to have a method of creating and removing electrical shorts as desired in sensitive electronic components that did not depend upon a physical application of a conductive circuit to the component. More specifically, it would be desirable to have a method of creating and removing an electrical short to prevent ESD/EOS damage in an MR head when desired and any number of times desired.

SUMMARY OF THE INVENTION

It is an object of the present invention to provide new and improved apparatus that is not subject to the foregoing disadvantages.

It is another object of the present invention to provide a method of repeatedly providing and removing electrical shunts to reduce or prevent ESD/EOS damage.

It is still another object of the present invention to provide a method of using radiant energy to create and remove electrical shunts to reduce or prevent ESD/EOS damage.

It is yet another object of the present invention to provide a method of using a laser beam of a first fluence to create a shunt on the interconnect of the HGA and of using a laser beam of a second fluence to ablate the shunt.

It is another object of the present invention to provide a method of applying a laser beam to the interconnect of the HGA to create a conductive pathway for the dissipation of static electrical charges.

It is still yet another object of the present invention to carbonize a polymeric component of the electrical interconnect of an MR head to create a shunt and to ablate the carbonized surface layer to remove the shunt.

The foregoing objects of the present invention are provided by a method for the substantially at-will creation of conductive pathways for the dissipation of static electric charges and the subsequent at-will removal of such pathways. The method includes the steps of providing an interconnect that is electrically connected to at least one component subject to damage from ESD/EOS; providing a conductive pathway on the interconnect; removing the conductive pathway when the ESD/EOS protection is no longer desired or required; and, if desired, re-establishing and reremoving a new conductive pathway on the interconnect. In one embodiment of the present invention, the conductive pathway is provided by exposing the interconnect's polymeric substrate to a radiant energy source. In another embodiment of the present invention the conductive pathway is removed by exposing the conductive pathway of the interconnect's polymeric substrate to a radiant energy source, which may be the same energy source as used to establish the conductive pathway in the first instance but operated according to different parameters such that the fluence of the radiant energy source is changed between the establishment and the removal of the conductive pathways. The fluence may be changed by increasing the operating power of the energy source or by focusing and defocusing the radiant energy source to alternately concentrate and disperse the energy as desired. In one embodiment of the present invention a laser beam may be used to create the conductive pathway.

The present invention further provides a method whereby a radiant energy source may be used either to carbonize a surface layer of a substrate supporting at least one electrical component or to carbonize the polymericmaterial that engages at least one surface of a pair of conductors. The carbonized surface layer of the substrate or of the cover layer provides an electrical pathway for the controlled dissipation of static electric charges rather than a damaging discharge (either high current transients, or a spark). When it is desired to remove the shunt, a radiant energy source can be used to ablate the carbonized surface, thereby removing the conductive pathway. Lasers can be used both to carbonize the polymeric surfaces of an interconnect to create the conductive pathway and to ablate the pathway when desired.

The present invention also provides for interconnects in accord with the present invention. Such interconnects include at least two conductive wires or leads engaged on at least one surface by a carbonizable and ablatable material. The conductive wires may each include a branched dead end lead portion interleaved with the branched dead end lead portion of the other. Alternatively, the conductive wires may extend in close proximity to each other in a curved or sinuous or serpentine or backtracking pattern. An interconnect in accord with the present invention may include a substrate substantially supporting the conductive wires except at predetermined locations or proposed shunt sites wherein there is at least one through hole in the substrate or the cover layer of the substrate or both.

The foregoing objects of the invention will become apparent to those skilled in the art when the following detailed description of the invention is read in conjunction with the accompanying drawings and claims. Throughout the drawings, like numerals refer to similar or identical parts.

BRIEF DESCRIPTION OF THE DRAWINGS

FIG. 4 is a top plan view of an interconnect.

FIGS. 8A and 8B illustrate an embodiment of an interconnect in accord with the present invention showing a cover layer over electrical traces supported on a substrate.

FIGS. 10A and 10B are obverse and reverse views of an interconnect in accord with the present invention wherein the substrate includes a plurality of through holes.

FIGS. 12A and 12B depict an another embodiment of an interconnect in accord with the present invention that includes a trace pattern having serpentine or interleaved trace patterns.

FIGS. 13A and 13B show in a perspective view another embodiment of an interconnect in accord with the present invention that includes a dual layer trace pattern.

FIG. 14 illustrates another embodiment of an interconnect in accord with the present invention including a plurality interleaved "dead end" traces substantially completely enclosed within a carbonizable cover layer.

DETAILED DESCRIPTION OF THE INVENTION

Figure 2:
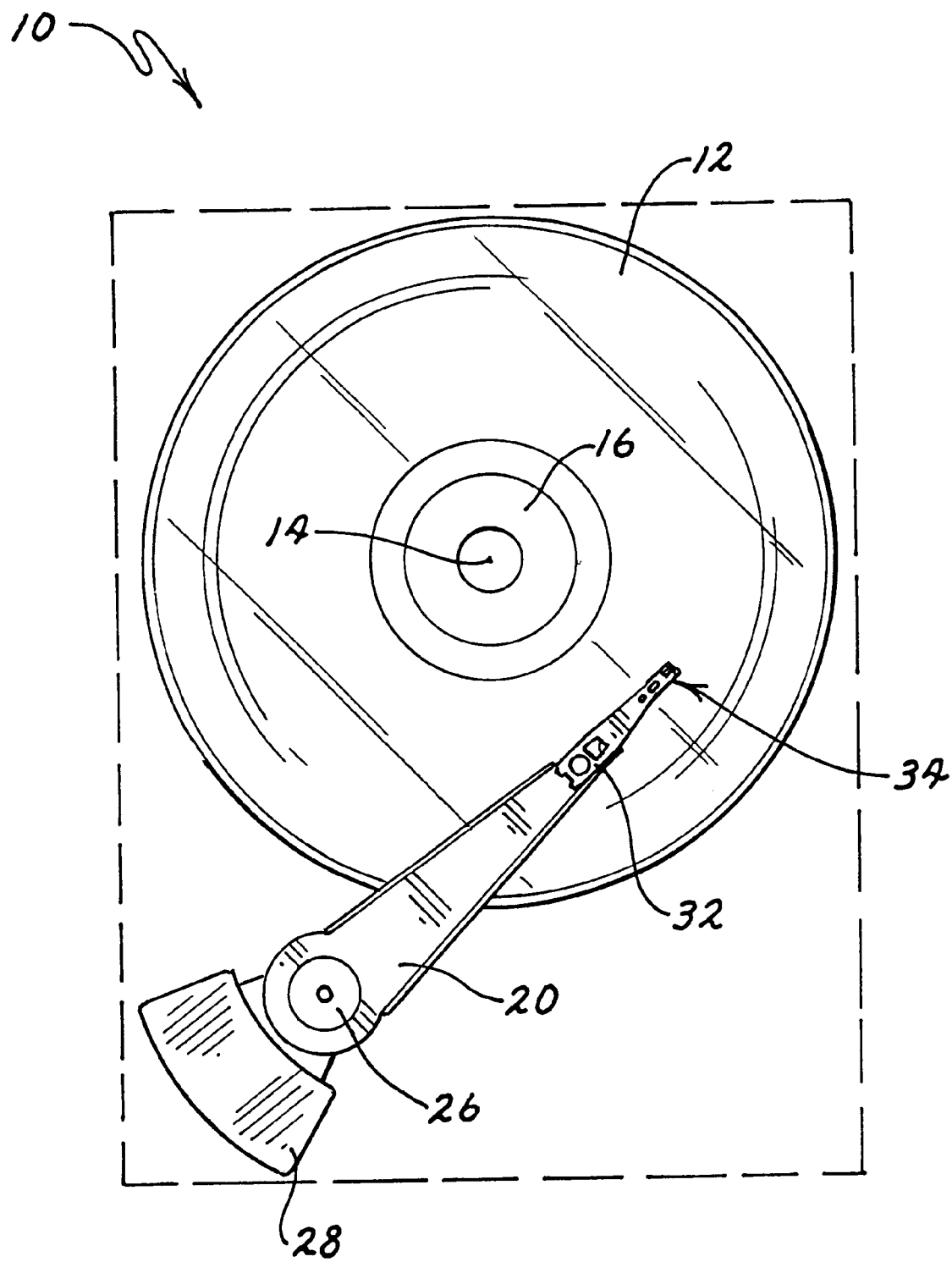
FIG. 2 is a top plan view of a hard disk drive.
Figure 3B:
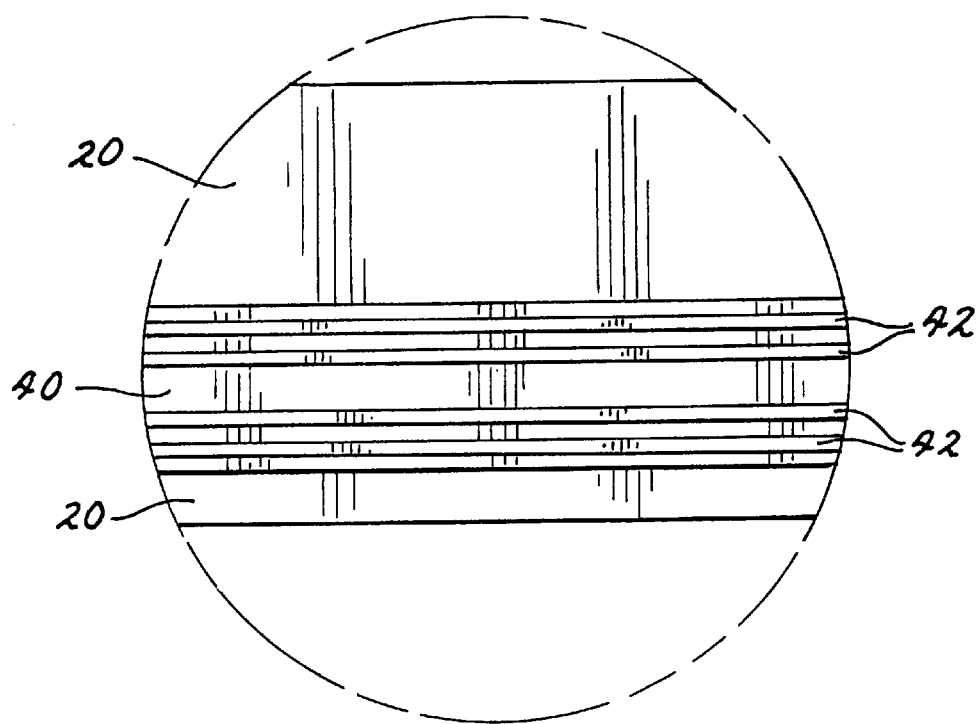
FIG. 3B is an enlarged view of the area shown in the phantom circle in FIG. 3A.
Figure 3A:
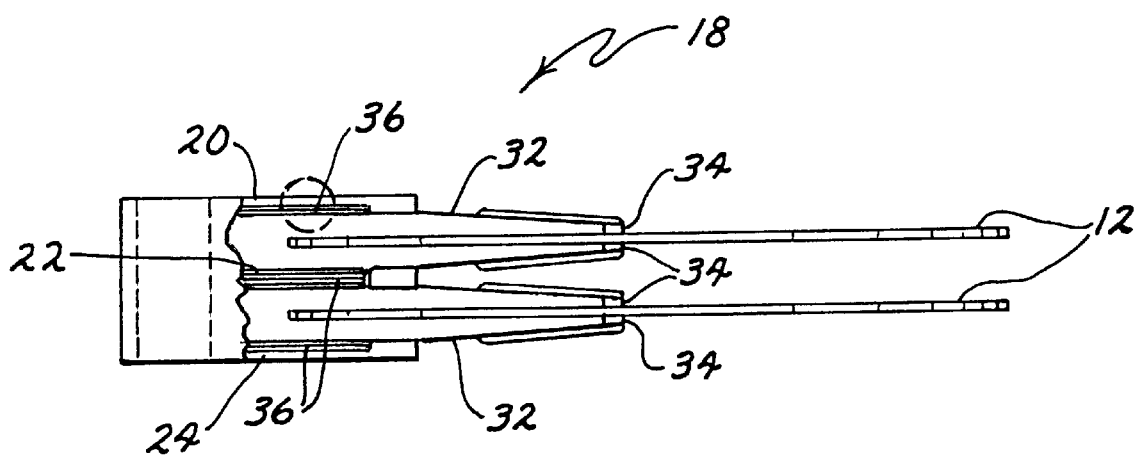
FIG. 3A is a side elevation, partial view of a hard disk drive, such as that shown in FIG. 1.

FIGS. 2, 3A and 3B illustrate a hard disk drive 10 in a top plan, highly schematic view. It will be understood that many of the components found in such a disk drive 10, such as a memory cache and the various controllers are not shown in the figure for purposes of clarity. As illustrated, drive 10 includes at least one, and typically several, disks 12 mounted for rotation on a spindle 14, the spindle motor and bearing not being shown for purposes of clarity. A disk clamp 16 is used to position and retain the disk 12 on the spindle 14. The disk drive 10 further includes an "E" block 18, best seen in FIG. 3A. The E block 18 gets its name from its shape as viewed from the side. It will be observed that E block 18 includes a plurality of actuator arms 20, 22, and 24, which are supported for pivotal motion by an actuator pivot bearing 26. A voice coil motor assembly 28 is used to control the pivoting motion of the actuator arms 20–24.

Each actuator arm 20–24 includes a head gimbal assembly 30 comprising a suspension 32, a read/write head/slider 34, and interconnect 36 that extends from the head/slider to the actuator flex 38. The dashed circle shows an expanded view of the arm 20, which includes a substrate 40 (wherein the bracket indicates the lateral extent of the substrate relative to the actuator arm 20 in this particular embodiment) upon which electrical leads or traces 42 are supported. The electrical conductors 42 are typically copper or copper alloy with a gold plating.

The substrate 40 will substantially underlie the traces 42. Substrate 40 may comprise a synthetic material such as polyimide, which may be of the type sold under the brand name Kapton® by I.E. DuPont. Polyimide, as is well known, is an organic polymer.

Figure 1:
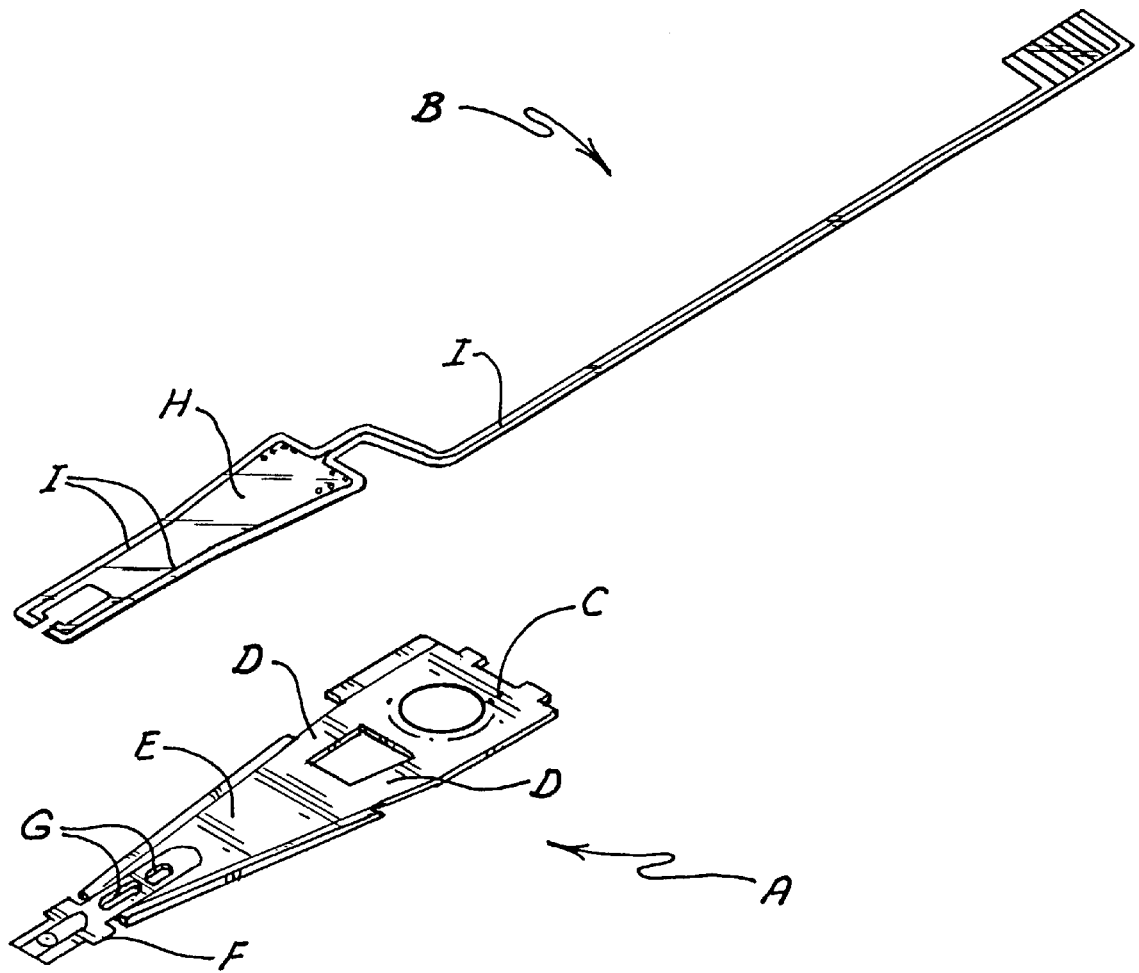
FIG. 1 is an illustrative, exploded, perspective view of atypical suspension/interconnect assembly.

FIG. 4 illustrates in a perspective view an interconnect assembly 44 of the type in which the present invention may find admirable use. Assembly 44, like that shown in FIG. 1, may have varying configurations depending upon the manufacturer. Assembly 44 includes a substrate 46 and a plurality of traces or leads 48. The assembly 44 may also include a cover layer 50. Also shown is a window or gap 52 in the cover layer where the present invention may find application, though the present invention may find application generally throughout the length of the assembly 44. The assembly 44 further includes termination pads 54 and may include test pads 56 in the general area indicated. Typically, that portion including the test pads 56 will be torn away or removed after testing is complete. The view taken along cross-section viewing plane 5—5 is shown partially in FIG. 5.

Figure 5:
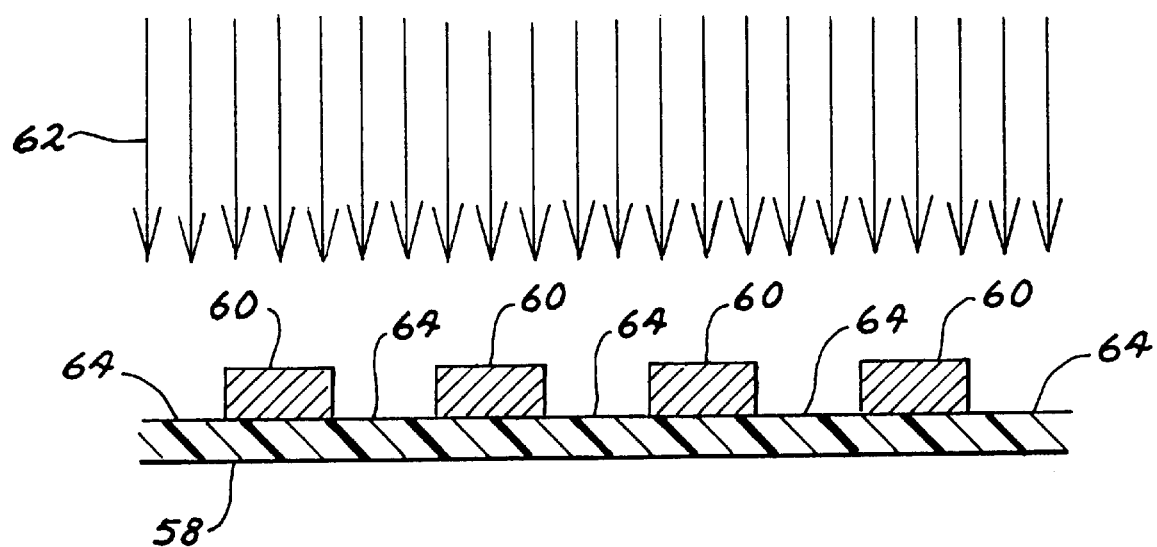
FIG. 5 is an enlarged sectional view of an interconnect shown in FIG. 4 taken along viewing plane 5—5.

Referring now to FIG. 5, the present invention will be described in broad detail. FIG. 5 illustrates a cross-sectional view of a substrate 58, which may be the substrate 40, supporting a plurality of spaced apart electrical leads or traces 60, which may be leads 42. Leads 60 are conductive and may comprise copper wires or other suitably conductive material. As indicated, a radiant energy source 62, such as ultra violet light produced by a laser, is applied to the substrate 58 and leads 60. The fluence of the radiant energy is preferentially chosen such that its application to the substrate 58 results in the "charring" or carbonization of the exposed surface 64 while leaving the leads 60 unaffected. The carbonized surface layer 64 is conductive, and thus provides a safe, discharge pathway for any static charges that may build up on an interconnect or suspension during assembly. Stated otherwise, with the present invention, the electrical interconnect is shunted, or shorted, by creating a conductive layer on the substrate surface between adjacent conductors at a site along the electrical interconnect. In one embodiment of the present invention, when a polyimide substrate surface at the desired shunt location site is irradiated with ultraviolet laser light pulses at the proper fluence level, a conductive surface layer, mainly composed of carbon, is formed. This conductive surface layer provides an electrical connection between adjacent conductors of the electrical interconnect. In addition, by increasing the fluence of the applied radiation, the carbonized surface layer 64 can also be removed, thereby removing the conductive layer and thus removing the shunt.

The carbonized layer produced on a polyimide substrate can exhibit resistivities as low as 0.05 ohm-cm, depending upon the carbon density of the created layer. The carbon density of the created conductive surface layer increases with increased pulses of radiant energy and increased fluences, as long as such fluences remain below the ablation threshold.

The present invention, then, provides a method for readily creating and removing a shunt that is completely devoid of any physical contact of the type that either can generate static electrical buildups in the first instance or can cause a discharge in a non-controlled manner. The conductive layer 64 is created by a non-contact application of a radiant energy, such as ultraviolet electromagnetic radiation, which may be created using known laser technology, and can be erased, cleaned, obliterated, or otherwise removed from the substrate as desired. This method enables the assembler of a hard disk drive or other electronic component to create and remove an ESD protecting shunt as desired at least once and typically a plurality of times. In this manner, then, the shunts can be applied, removed, reapplied and re-removed as desired, thereby maintaining a protective shunt in place at all times except when such a shunt would interfere with normal assembly or test procedures, such as when a dynamic electrical test of the read/write head is conducted.

The shunting and de-shunting procedures can be repeated at the same site along the electrical interconnect, or, if desired, at a different site. For shunting purposes, the size of the irradiated site should be considered in determining how to provide adequate conductivity between conductors. A larger irradiated site length will provide lower resistance and better shunting performance.

Suitable radiant energy sources include excimer lasers or solid-state lasers; it being understood, however, that any other radiant energy source capable of preferentially carbonizing the surface of a polymeric material may find employment with the present invention.

More generally, the present invention can be used wherever it is desired to create a shunt between at least two spatially separated, that is, otherwise electrically insulated, electrically conductive components at least partially engaging a common carbonizable insulator, including but not limited to a polymeric substrate or base or cover layer. A source of radiant energy can be used to apply radiant energy to the common substrate or base to create a carbonized surface layer interconnecting the electrically conductive components that will function as an electrical conductive pathway between them. The surface conductive path can be removed as desired using a higher fluence radiant energy source.

Additionally, the present invention can be used wherever it is desired to create a shunt between at least two spatially separated, that is, otherwise electrically insulated, electrically conductive components having at least one surface engaged by a common polymeric overlay. A source of radiant energy can be used to apply radiant energy to the polymeric overlay to create a carbonized surface layer interconnecting the electrically conductive components that will function as an electrical conductive pathway between them. The surface conductive path can be removed as desired using a higher fluence radiant energy source. It will be understood that the present invention will also provide for the carbonization of any other polymeric materials that are disposed between adjacent conductors.

Figure 6A:
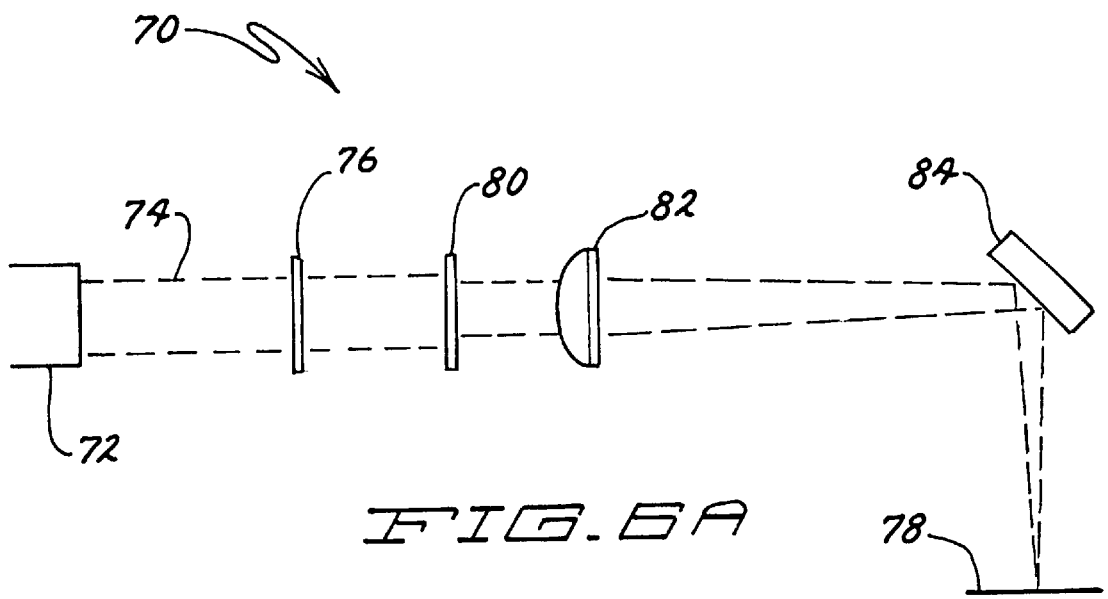
FIGS. 6A and 6B illustrate in schematic form an apparatus useful in practicing the present invention.
Figure 6B:
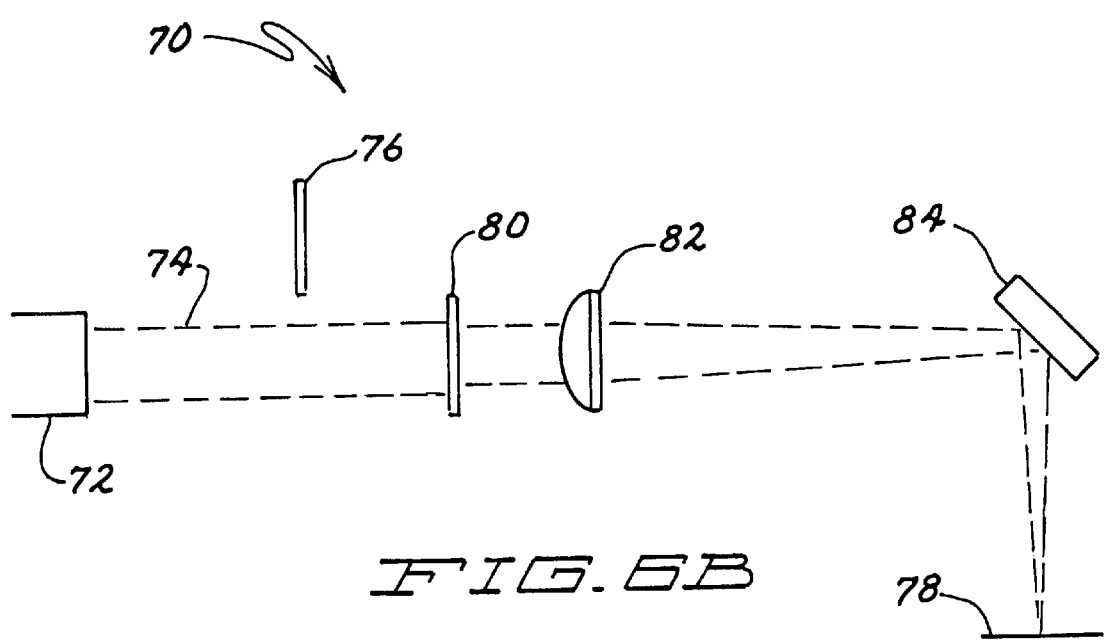

FIGS. 6A, 6B, 7A, and 7B will now be discussed. FIGS. 6A and 6B illustrate in schematic form an apparatus 70 useful in accord with the present invention. As shown, a radiant energy source, such as an ultraviolet laser, 72 provides a radiant beam 74 that is directed through a neutral density filter 76. The filter 76 operates to reduce the fluence of the beam 74 to a level that is optimal for creating a carbonized, conductive surface layer on the surface of a workpiece 78, which may be an interconnect for an HGA by way of example only. A mask 80 is disposed in the path of beam 74 to pattern the beam in the desired manner and thereby affect only those portions of the workpiece desired to be affected. The beam 74 is then directed through a focusing means 82 such as the plano-convex lens illustrated in the drawing and subsequently reflected off a mirror 84, which may be a 45° ultraviolet-grade mirror, onto the workpiece 78 to produce a carbonized surface. The apparatus 70 can thus be advantageously used to produce a shunt for an interconnect as previously described.

Referring specifically to FIG. 6B, when the removal of the carbonized surface layer is desired, that is, when it is desired to remove the shunt previously created, the filter 76 can be removed from the path of the beam 74, thus allowing the full fluence of the beam 74 to be applied to the workpiece 78.

Figure 7A:
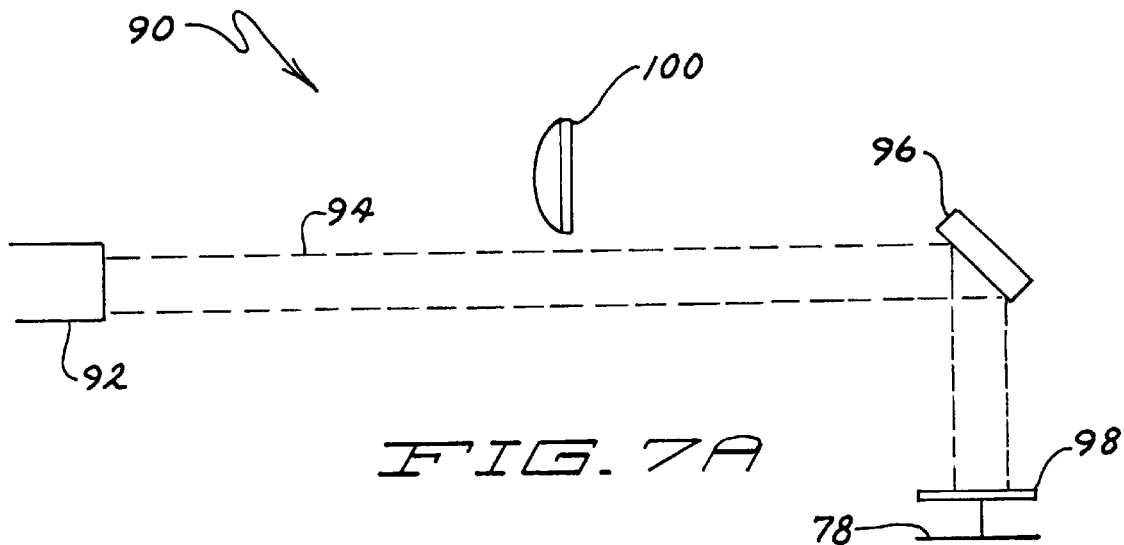
FIGS. 7A and 7B illustrate in schematic form another apparatus useful in practicing the present invention.
Figure 7B:
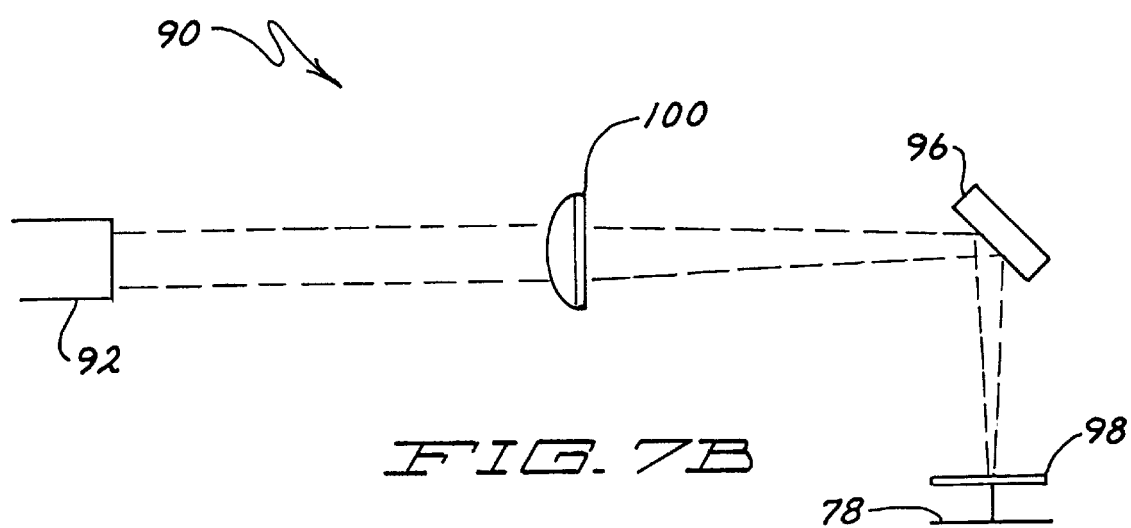

FIGS. 7A and 7B illustrate in schematic form another apparatus 90 useful in accord with the present invention. As shown in the Figures, a radiant energy source, such as an ultraviolet laser, 92 provides a radiant beam 94 that is reflected off a mirror 96, which may be a 45° ultraviolet-grade mirror, through a mask 98 to control the size and pattern of the beam applied to the workpiece 78 to produce a carbonized surface. The full fluence of the beam 94 is thus applied directly to the workpiece. As with the apparatus 70, the apparatus 90 can thus be advantageously used to produce a shunt for an interconnect as previously described.

Referring now to FIG. 7B, when the removal of the carbonized surface layer is desired, that is, when it is desired to remove the shunt previously created, a focusing means 100, such as the plano-convex lens shown in the figure, can be placed in the path of the beam 94, thereby concentrating the full fluence of the beam 94 to increase its fluence at the workpiece 78 to a level sufficiently high to ablate the carbonized surface previously produced on the workpiece 78.

It is well understood that certain laser beams do not produce a uniform fluence across the beam area. Therefore, with certain laser beams it may be necessary to include a homogenizer to provide a uniform beam.

It has been found that a carbonized surface can be produced on a polyimide substrate where the fluence level of the applied laser beam is about 60 millijoules per square centimeter ($mJ/cm^2$) and that the carbonized surface can be ablated or otherwise removed at a fluence level of about 140 $mj/cm^2$. Thus, in FIG. 6A, the radiant energy source 72 would produce a raw beam having a fluence level of about 140 $mj/cm^2$, which is subsequently moderated by the filter 76 to a fluence level of about 60 $mj/cm^2$ while the radiant energy source 92 of FIGS. 7A and 7B would produce a beam having a raw power level of 60 $mj/cm^2$ which is subsequently concentrated by the focusing means 100 to produce a power level of 140 $mj/cm^2$. Other fluence levels can also be used to create and remove shunts on polyimides in accord with the present invention. Additionally, other materials used to support and insulate the leads may require other fluence levels.

Referring now to FIGS. 8A and 8B, an interconnect 110 useful in accord with the present invention is shown in a partial perspective view. Interconnect 110 includes a substrate 112 supporting a plurality of electrical leads 114 and a cover layer 116 comprising an overcoated polymer. Cover layer 116 can be in the form on one or more segments, with adjacent segments defining therebetween a "potential shunting sector," that is, an area or window 118 of the interconnect 110 that will be subject to shunting and deshunting. Also shown in the Figure are electrical contacts 120.

As seen in FIG. 8B, a shunt 122 can be created by exposing a portion of the substrate 112 and cover layer 116 to a radiant energy source to carbonize the surface layer of both. When the carbon layer 122 is ablated, that is, the shunt 122 is removed, then the overcoat layer 116 will act as a barrier to assure that the edges of the energy stream do not create further carbonization and in effect, reshunt the electrical leads as the previously applied shunt is being ablated.

Figure 9:
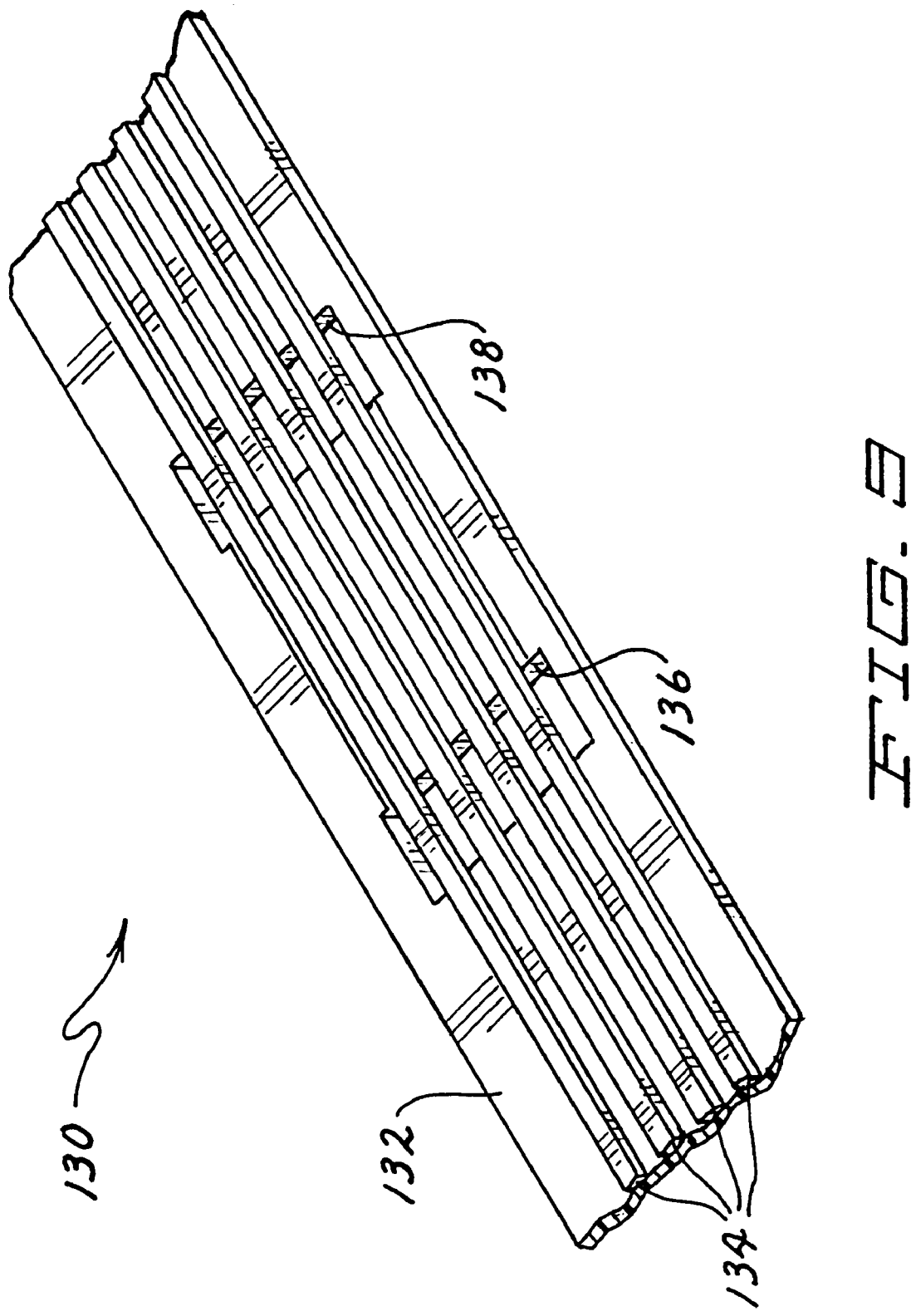
FIG. 9 illustrates another embodiment of an interconnect in accord with the present invention wherein the substrate includes a plurality of through holes.

FIG. 9 illustrates another embodiment of a portion of an interconnect in accord with the present invention. FIG. 9 illustrates an interconnect 130, which includes a substrate 132 supporting a plurality of electrical leads 134 and a plurality of through holes 136 and 138. The through holes 136 and 138 define the limits of the potential shunt and deshunt area. That is, the through holes 136 and 138 prevent the formation of a surface conductive layer between the traces 134 since the substrate has been removed as a support. The through holes 136 and 138 thus function similarly to the cover layer 116, yet avoid the need to lay down the over coat.

Figure 10B:
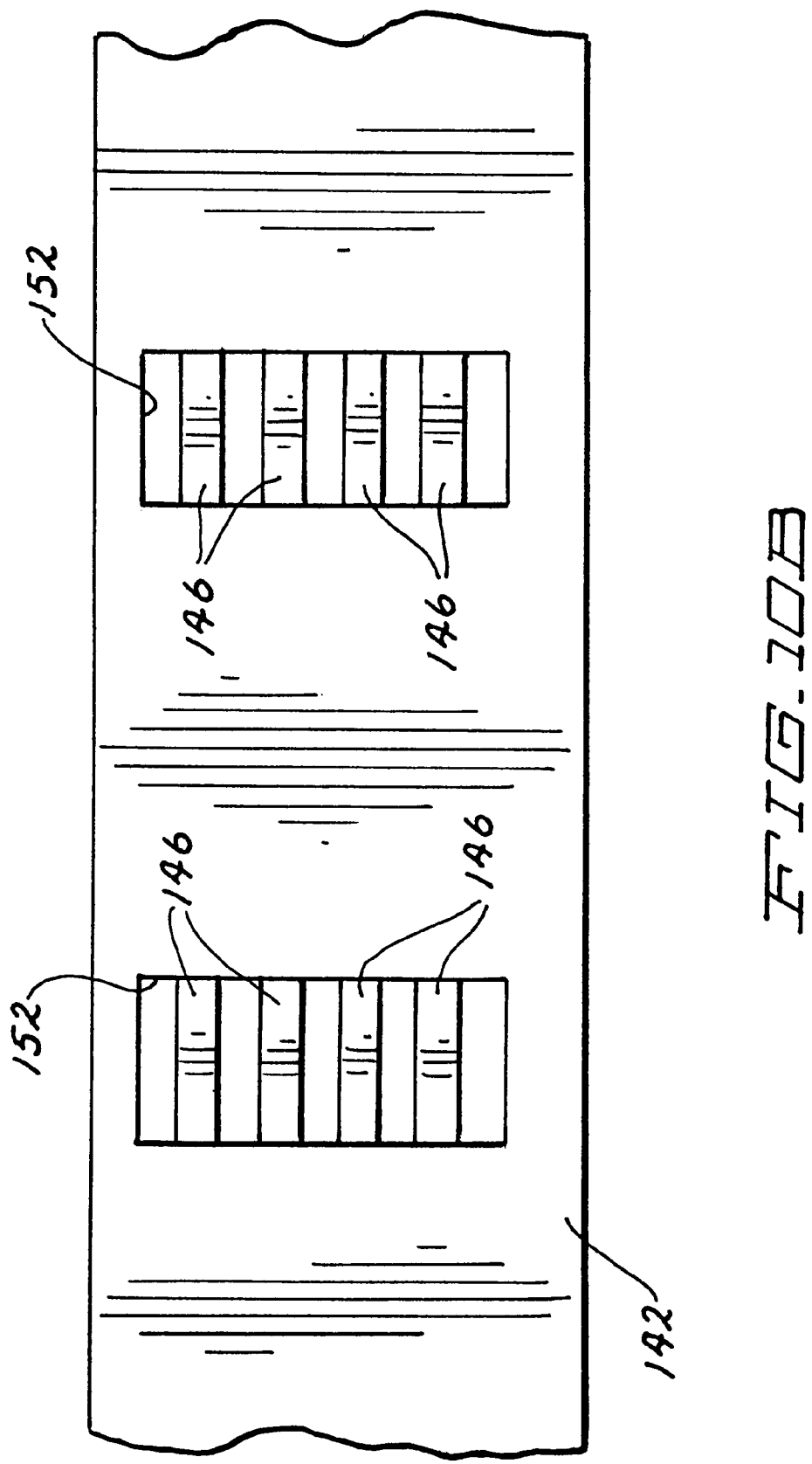

Referring now to FIGS. 10A and 10B, another embodiment of the present invention, which advantageously incorporates the features of the embodiments of FIGS. 8A, 8B and 9, will be described. FIGS. 10A and 10B illustrate an interconnect 140, which includes a substrate 142 supporting a plurality of electrical contacts 144, corresponding leads 146, and a cover layer 148 comprising an overcoated polymer. Cover layer 148 can be in the form on one or more segments, with adjacent segments defining therebetween a "potential shunting sector" or shunting window 150. As seen in FIGS. 10A and 10B, the substrate 142 includes a plurality of through holes 152. These through holes define the limits of the substrate area subject to shunting and deshunting. That is, the through holes 152 prevent the formation of a surface conductive layer between the traces 146 since the substrate has been removed as a support.

Figure 11:
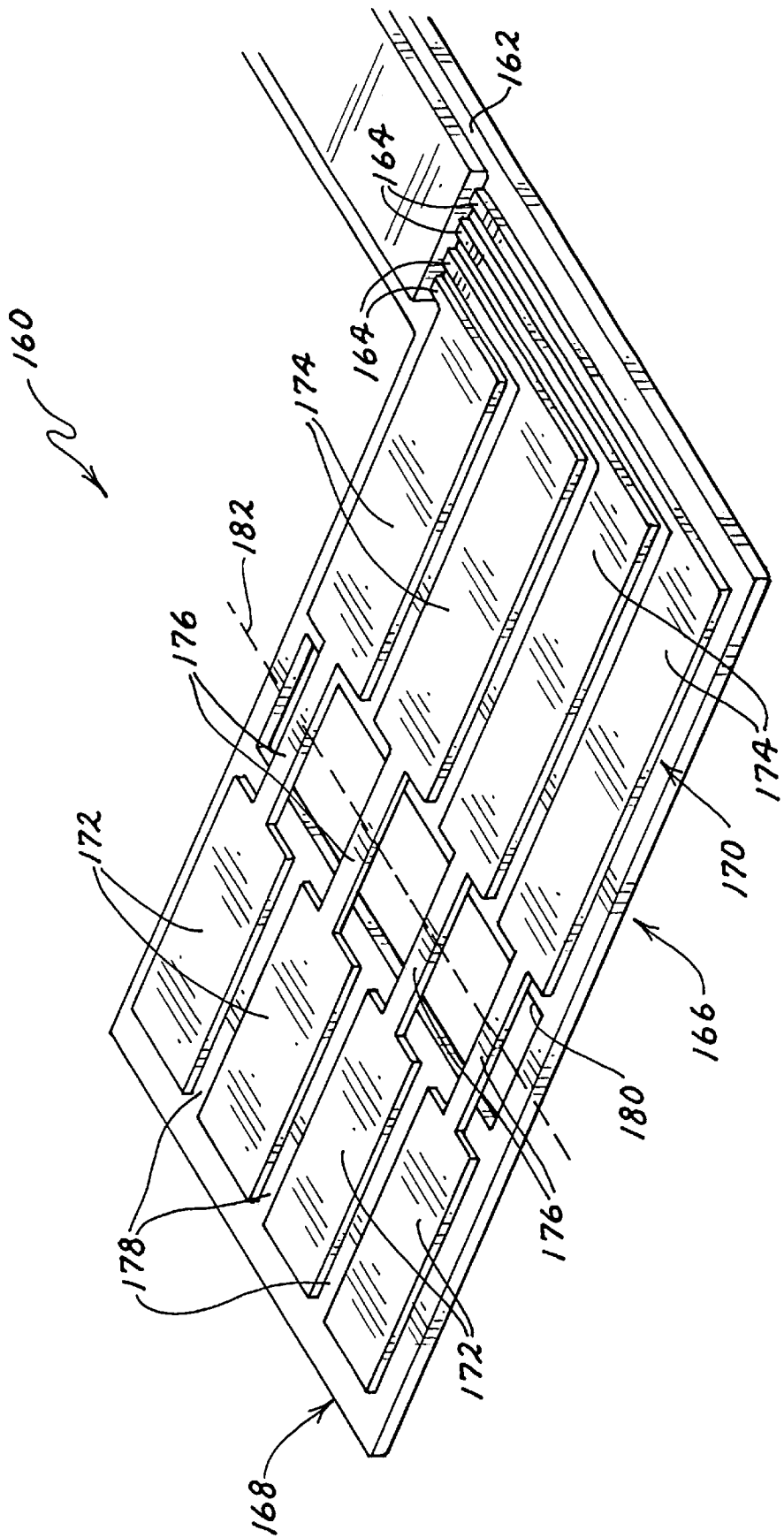
FIG. 11 illustrates in a perspective view another embodiment of an interconnect in accord with the present invention that includes a multiply-shuntable, tear-away or shearable portion.

Another embodiment 160 of an interconnect in accord with the present invention is illustrated in FIG. 11. The interconnect 160 includes a substrate 162 that supports a plurality of leads 164. It will be observed that the interconnect 160 includes a terminal end 166 defining a tear-away or shearable portion 168 and an electrical connect portion 170. Terminal end 166 includes a plurality of temporary, tear away or shearable shunt electrical pads 172 and a corresponding plurality of permanent electrical connection pads 174 electrically connected by a similar corresponding plurality of tear-away or shearable leads 176. Like the connection pads 174, the shunt electrical pads 172 are supported upon a substrate that produces a conductive surface area when exposed to a radiant energy source. Thus the surface areas 178 between the shunt pads 172 can be made electrically conductive. The terminal end 166 also includes a through hole 180 underlying the tear-away leads 176. Thus, with this embodiment, the areas 178 can be shunted and deshunted in the manner hereinbefore described. When the shunt is no longer required, the tear-away portion 168 can be severed from the portion 170, for example, along the dotted line 182. In this manner, then, the entire tear-away portion can be removed from the finished product and no trace of the shunting/deshunting operation will remain.

With the foregoing invention, the thin, carbon surface layer produced on the interconnect has a high resistivity. It is desirable, however, to minimize the resistance between adjacent conductors, such that the majority of a current transient resulting from an ESD event passes through the shunt, rather than the ESD sensitive device. One manner of affecting the resistance is to vary the length being shunted and thus vary the resistance. Thus, increasing the length of the area (length of conductors exposed to the shunt) that forms the shunt will decrease the shunt's resistance.

This following equation describes the relation between the shunt resistance and other variables of interest:

$$R = \rho \frac{L}{WT}$$

where:
R=Resistance of shunt (ohms)
p=proportionality constant of the carbon layer (0.05 to 0.1 ohms-cm)
L=Distance between conductors (0.03 mm to 0.05 mm)
W=Length of conductors aligning the shunt
T=Thickness of the carbon layer (~50 nm).

As shown by this equation, the shunt resistance is inversely proportional to the length W of the conductors in the irradiated site and is directly proportional to the conductor spacing L.

With regards to MR heads, it is generally desirable to provide less total resistance in the shunt than in the read/write head (since current will follow the least resistance path). This can be accomplished by meandering the traces back and forth on themselves in a sinuous or serpentine manner since the increased length of the traces that are shunted results in a decrease in total shunt resistance. Therefore, the affected length of the traces due to the creation of the shunt by the radiant energy source can be longer than with normal non-serpentine traces. For example, normally the length of the traces shunted may be in the range of about 2 to about 4 mm while the length of the shunted traces may be substantially longer, say 30 mm, where a serpentine trace path is used. From the equation above, this results in a reduction in the shunt's resistance of one order of magnitude or a factor of 10.

Simply adding length to the traces is insufficient, however, since negative effects due to the length addition must be avoided. For example, if the length were to be increased in the zone between the actuator flex termination pads and the head, it would increase the trace length between the head and preamplifier, thus diminishing the read and write speed of the head. Positioning of the increased length due to the serpentine or sinuous pattern is thus critical to achieving the desired increase in trace resistance without compromising the performance of the read/write head. For example, the serpentine pattern can be disposed past the actuator termination zone and even past the test pads. In that manner, this extra lead (trace) length won't affect drive read or write performance, nor will it impact performance during in-process electrical tests, such as dynamic electrical tests (DET).

FIGS. 12A and 12B illustrate another embodiment of an interconnect in accord with the present invention that takes advantage of an increased shunt length. FIG. 12A illustrates, then, a portion of an interconnect 190 having a serpentine trace pattern that provides the desired increased trace length without degrading the performance of the read/write head. Interconnect 190 includes a substrate 192. The substrate 192 includes a plurality of conductive contacts 194A–E that may overlay through holes in the substrate, which thereby allow electrical contact to be made from both sides of the interconnect 190. Contact 194A is the ground contact, while contacts 194B and 194C extend to and from the write head and contacts 194D and 194E extend to and from the read head. Leads 196 extend from each of the contacts 194A–E. Thus, a lead 196A extends from ground contact 194A to a ground termination (not seen). Furthermore, leads 196B and 196C extend from the write contacts 194B and 194C, respectively and extend to the electrical component to be protected, such as a write head. Leads 196D and 196E extend from the read contacts 194D and 194E, respectively, to form a serpentine pattern as indicated generally at 198.

The placement of the shunt across the serpentine read leads and the write leads effectively creates a plurality of resistors in parallel, thus lowering the overall resistance of the shunt relative to the leads. Thus, the present invention also provides a method for creating a plurality of parallel resistors useful as shunts to prevent damage due to EDS/EOS.

Referring now to FIG. 12B, another embodiment of an interconnect 200 useful for reducing the potential for damage due to EDS/EOS is shown. Interconnect 200 depicts a substrate 202 supporting a ground contact 204A, write contacts 204B, 204C and read contacts 204D, 204E. Leads 206A–E extend from contacts or pads 204A–E respectively. Lead 206A extends from ground contact 204A. Leads 206B and 206C extend substantially linearly from contacts 204B and 204C respectively to the MR head. Lead 206D extends from read contact 204D towards the MR head and then branches into a plurality of individual leads 208. In the embodiment shown here, it will be observed that the leads 208 extend substantially parallel to each other, though the present invention does not require that the leads be parallel. Lead 206E extends from read contact 204E toward the MR head and branches into a plurality of leads 210 that are interleaved with leads 208. The shunt can be applied using the methods previously and hereafter described to the interconnect 200 substantially anywhere along the length of the traces or leads 206B–E, though doing so in the area of the interleaved leads 208 and 210 will provide the previously discussed advantage of lowering the resistance of the shunt relative to the leads.

In each of the FIGS. 12A and 12B a shunt 212 is shown in a dotted outline where it could be advantageously created. It will be understood that a shunt could be advantageously created at other locations and that the use of cover layers and through holes is also contemplated.

As used herein, "serpentine" is not intended to be limited in its scope to a strictly "back and forth" trace pattern as shown in FIGS. 12A and 12B. Rather, any trace or lead pattern that involves intertwining the leads or extending a plurality of leads from a single lead in an intertwined manner in close proximity to each other is within the scope of the present invention.

Figure 13A:
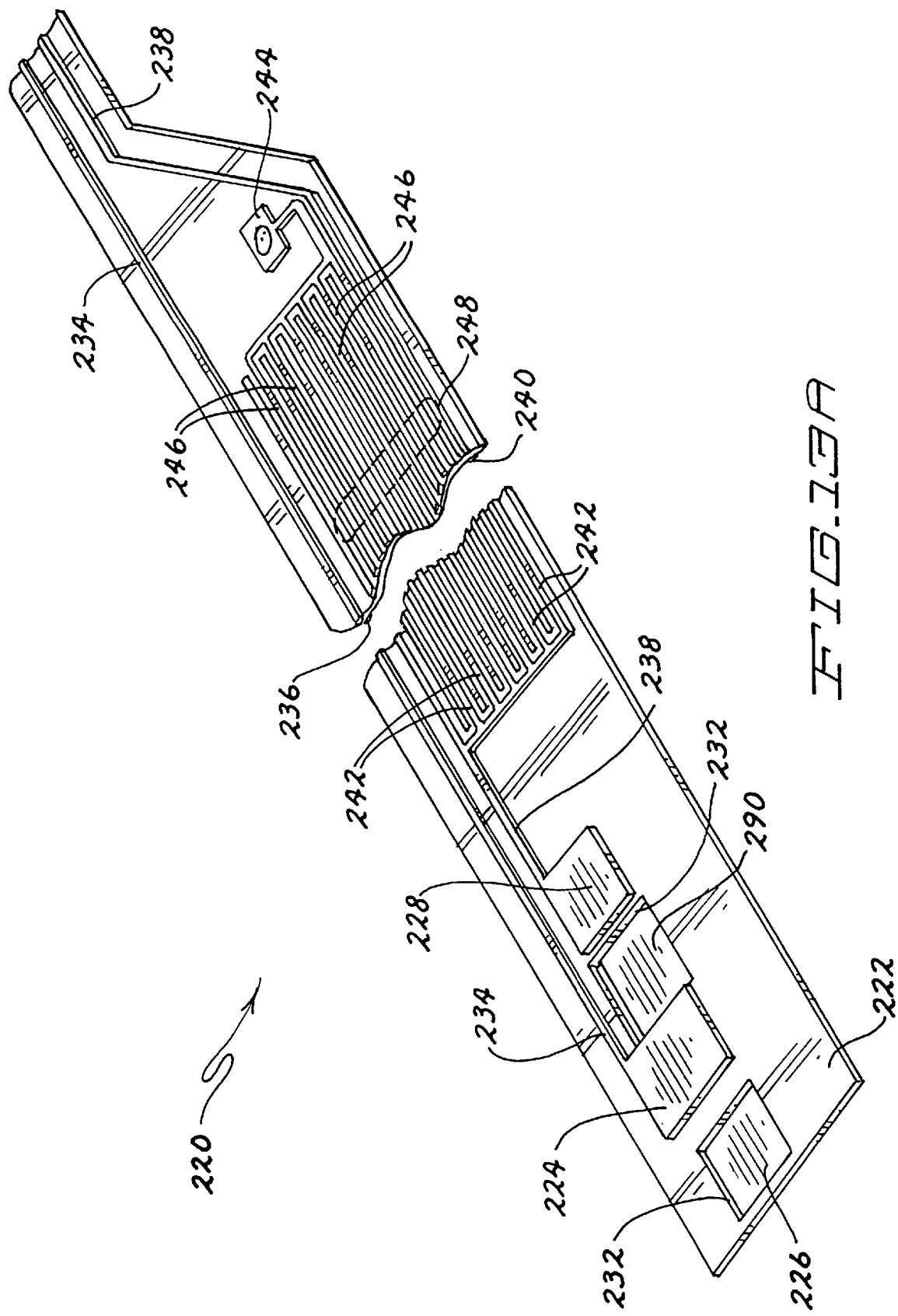

FIGS. 13A and 13B illustrate another embodiment of an interconnect 220 in accord with the present invention that includes a dual layer trace layout. In a dual trace interconnect, at least one of the the read and/or write trace pair has one trace or lead on one side of the substrate and another trace on the other side. As seen in the Figures, interconnect 220 includes a substrate 220 supporting on opposing sides thereof at least a pair of write contacts 224 and 226 and a pair of read contacts 228 and 290. Contacts 226 and 290 each overlie a though hole 232 extending through the substrate 222, thereby allowing electrical contact to be made with all four contacts on one side of the substrate if desired. Write leads 234 and 236 extend from write contacts 224 and 226 respectively toward the MR head while leads 238 and 240 extend from read contacts 228 and 290 respectively. Lead 238 branches into a plurality of leads 242. Lead 240 extends to a plated through hole 244 which in turn branches into a plurality of leads 246 that are interleaved with leads 242. The plated through hole 244 therefore provides conductivity between the obverse and reverse sides. Creating the shunt 248 shown in phantom, then, across the interleaved leads 242 and 246, then will provide the same form of ESD/EOS protection as that provided in FIGS. 12A–12C.

FIGS. 14 and 15 will now be described. FIG. 14 illustrates another embodiment of an interconnect 300 in accord with the present invention. Interconnect 300 includes a substrate 302 that supports a plurality of traces 304A–304D, with leads 304A and 304B being write traces, and leads 304C and 304D being read traces. Leads 304C and 304D branch into a plurality of interleaved dead end leads 306 and 308 respectively. The dead end leads function similarly to the interleaved dead end leads of FIGS. 12B and 13A, but are oriented substantially at right angles to the longitudinal axis of the interconnect. FIG. 14 thus illustrates that the interleaved dead end leads could be oriented at any angle relative to the longitudinal extent of the interconnect, that is, parallel to, perpendicular to or any angle in between, and still provide the function of lowering the resistance of the shunt relative to the leads themselves. Thus, the present invention contemplates that any orientation of such interleaved leads are within its scope.

The interconnect 300 further includes a cover layer 310, which may be substantially coextensive with the substrate or may be discontinuous. As illustrated the cover layer 310 not only engages the top surfaces 312 of the traces 304A–304D but substantially fills the space between them also. Thus, an interconnect in accord with the present invention may include a plurality of spaced apart traces wherein at least a pair of the traces will each have a carbonizable material engaged or touching at least one surface of the traces. The interconnect 300 includes a plurality of traces encapsulated by carbonizable material, though, as noted, the present invention would include interconnects where only a single surface of the traces contacted the carbonizable material as shown in FIGS. 8A–13B. Such a complete encapsulation is not necessary, then, for an interconnect to fall within the scope of the present invention. Furthermore, even though FIGS. 15A illustrates an embodiment where the coverlayer touches the top surfaces 312 of the leads, such a cover layer could be applied to an interconnect except where a trace pattern such as that shown in FIGS. 12A–14 is present, with the cover layer not covering the top surfaces of the leads in that area.

Figure 15A:
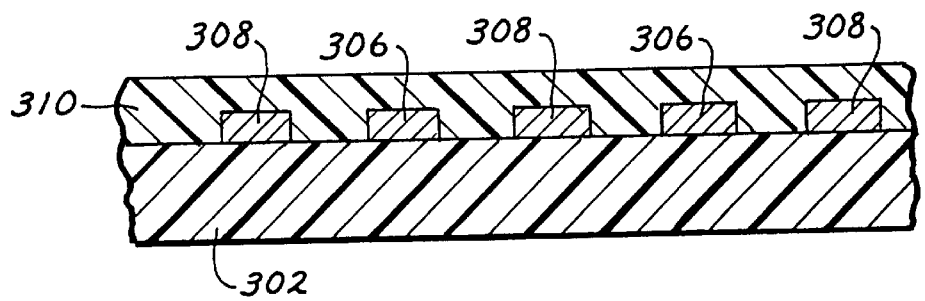
FIGS. 15A–15E depict in a cross sectional view the interconnect of FIG. 14 taken along viewing plane 15—15 thereof and illustrates a method and interconnect in accord with the present invention.
Figure 15B:
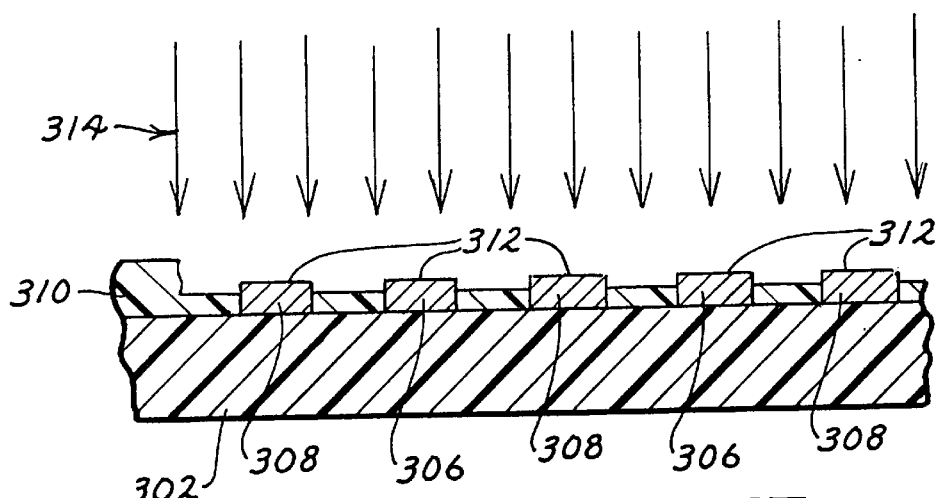

Reference will now be made to FIGS. 15A–15E, which illustrate a process in accord with the present invention. FIG. 15A is a cross section of the interconnect 300 taken along plane 15—15 of FIG. 14. FIG. 15A illustrates an interconnect prior to the beginning of the shunting process with a completely intact cover layer 310. FIG. 15B shows the application of a radiant energy 314 such as that provided by a UV laser source. The applied energy is of sufficient fluence and duration that the cover layer 310 is ablated as a result of its application to a depth sufficient to expose the top surface 312 of at least a pair of adjacent conductors. Alternatively, the interconnect 300 or any other interconnect with a varying trace pattern could begin the process with the conductors 304B–304D exposed.

Figure 15C:
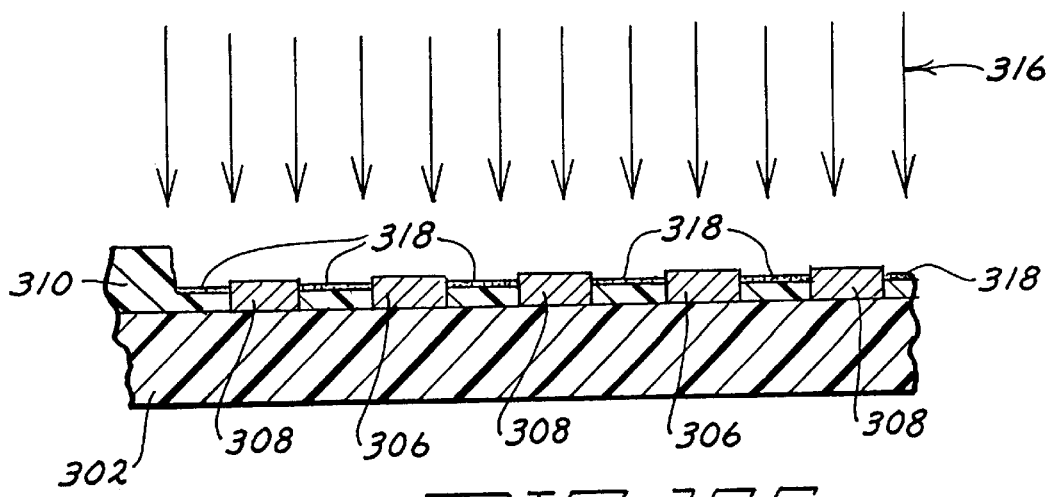
Figure 15D:
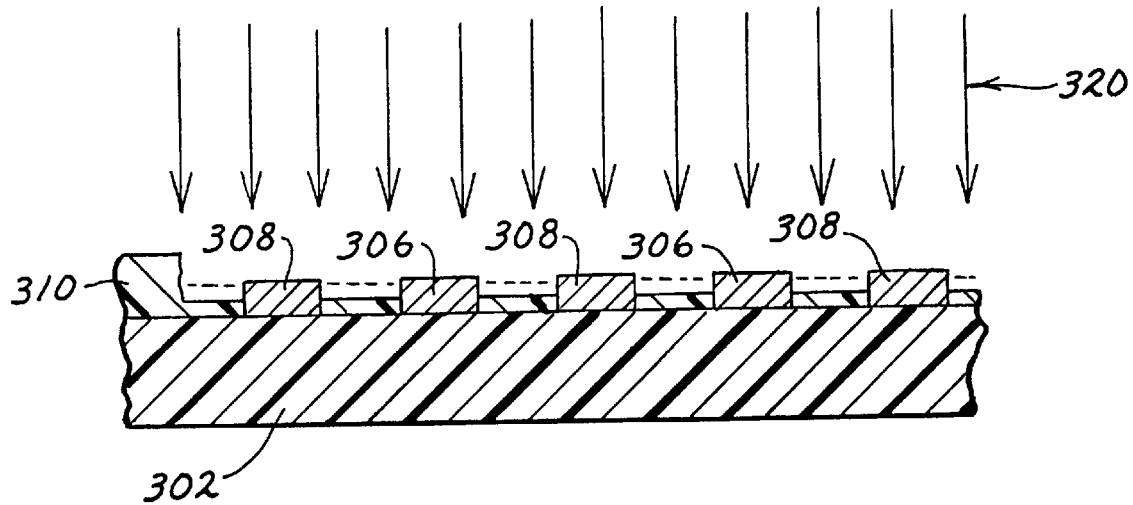
Figure 15E:
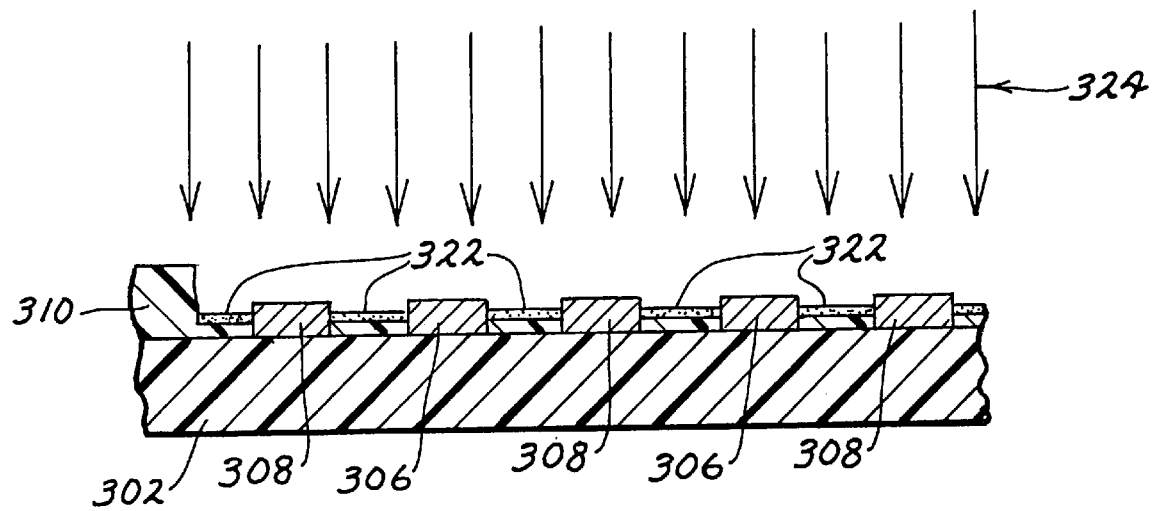

After the top surfaces 312 of the leads are exposed, a radiant energy 316 of a second, reduced fluence can be applied to the cover layer to create a carbonized surface or shunt 318 as previously described between a pair of adjacent leads as illustrated in FIG. 15C. The shunt 318 can be removed as illustrated in FIG. 15D by the application of an ablating radiant energy 320, which may have the same fluence as the radiant energy 314 and may be from the same source. As previously noted, a new shunt 322 can then be recreated by the application of a carbonizing radiant energy 324, which may have the same fluence as radiant energy 316 and may be from the same source. In this manner, then, the shunt may be created, removed, recreated and re-removed as desired without physically engaging the interconnect.

It will be observed in FIGS. 15A–15E that the process of shunting, deshunting, and reshunting an electrical component in accord with the present invention results in an "erosion" or dissipation of the material being carbonized and ablated. Thus, the embodiment shown in FIGS. 14 and 15A–15E provide an advantage over those shown in the other figures in that it provides a ready reservoir of carbonizable and ablatable material, whereas the other embodiments illustrated in the other figures would eventually result in an erosion of material away from the leads.

Figure 16:
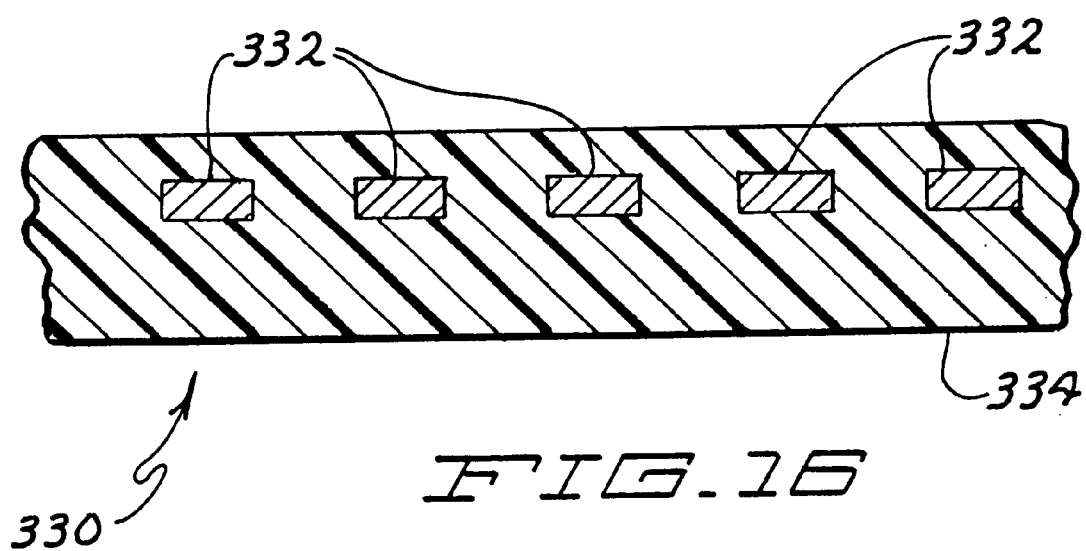
FIG. 16 illustrates in a cross section view another embodiment of an interconnect in accord with the present invention and shows a plurality of electrical traces embedded substantially within a single carbonizable, ablatable material.

FIG. 16 illustrates yet another alternative embodiment 330 of the present invention wherein the leads 332 are supported by a singular carbonizable and ablatable material 334. That is, the present invention will find use where the electrical conductors to be shunted are supported by a substrate of one material and engaged by a cover layer of a second material and where the conductors are engaged by a single material. That is, the present invention will prove useful where a pair of adjacent conductors are engaged by one or more carbonizable and ablatable materials.

The present invention having thus been described, other modifications, alterations, or substitutions may now suggest themselves to those skilled in the art, all of which are within the spirit and scope of the present invention. For example, rather than creating the shunt directly on the substrate, a carbonizable and ablatable material, such as an adhesive, may be used to fill the spaces between the leads on the substrate. That is, the adhesive or carbonizable/ablatable filler material could be laid down between the leads and then could be converted into a shunt and subsequently removed in any acceptable non-contact method including the application of a radiant energy source such as a laser beam.

In addition, the present invention could find many instances of application during the process of assembling a hard disk drive. By way of example only and without any intent to limit the scope of the present invention or the attached claims, the process could find use while: shunting the slider body of a read/write head; shunting the suspension; shunting a pre-amplifier; shunting a micro-actuator; creating a shunt at a site behind the test pads; creating a shunt a site between test pads and termination pads; creating a shunt at a site between termination pads and head; creating a shunt at an intermediate circuit between the head and actuator flex; or by creating a shunt on a dual layer interconnect.

In addition, by way of example only and without any intent to limit the scope of the invention or the attached claims, the present invention finds use with a laser operating just below the ablation threshold during carbonization; performing the processes at the circuit(component) level process; performing the process at the head gimbal assembly or test process; performing the process at the head stack assembly or test process; performing the process at the drive level assembly or test process; while parts are fed past the laser and optics; while parts are in a holding tray or fixture and the tray is positioned with respect to the laser and optics; while the parts are positioned manually with respect to the laser and optics; while a beam steering mechanism is used to direct the laser beam at the parts being acted on; while measuring resistance during the process for process feedback; while the parts are in an inert environment; while the parts are in an oxygen rich environment; acting on designs that open at the beam perimeter; acting on polymer fill; acting through the substrate; where the polymer is acrylic based; where the material is a composite; using the process in combination with a removable section; using the process on multiple sites along the interconnect to create a plurality of shunts simultaneously or at separate times; performing the process with vacuum or air to remove debris; and while targeting specific resistance values to be achieved in the shunt.

In addition, again by way of illustration and not as a limitation on the invention or the attached claims and as described in some cases above, the present invention may find use on a coverlayer boundary; coverlayer holes; substrate holes; trace separation or routing; with an excimer laser; with an imaging lens; with a mask; with an attenuator; with a laser beam homogenizer; by using the $3^{rd}$ and $4^{th}$ harmonic of a Nd:YAG laser; with a polymer/conductor; with a polymer and a semi-conductor; material.

As illustrated herein, the present invention finds a wide variety of applications. It is therefore intended that the present invention be limited only by the scope of the attached claims below.

What is claimed is:

1. A method for substantially protecting an electronic component from ESD/EOS, said component including a plurality of spaced apart leads for conducting electric current and a carbonizable material engaging at least one surface of each of at least a pair of adjacent leads, said method comprising:
    applying radiant energy of sufficient fluence and duration to a predetermined area of the carbonizable material to produce a carbonized surface area on the carbonizable material between adjacent leads, wherein the carbonized surface area provides a shunt between the leads.

2. The method of claim 1 wherein the electronic component is a read/write head of a hard disk drive.

3. The method of claim 2 wherein the carbonizable material is a polymer substrate supporting the space apart leads.

4. The method of claim 1 wherein the leads are supported on a substrate and the carbonizable material is a polymer cover layer.

5. The method of claim 4 wherein the electrical component is a read/write head of a hard disk drive and the leads are a portion of the electrical interconnect leading to and from the read/write head and wherein the carbonizable material is a polymer substrate, the substrate including top and bottom sides and supporting the leads on the top side thereof, said method including:
    ablating the bottom side of the substrate to expose the leads and the cover layer.

6. The method of claim 5 wherein that portion of the cover layer that is exposed by the ablation of the substrate is carbonized.

7. The method of claim 4 wherein the leads have a top surface and the method further includes:
    ablating the cover layer such that the top surfaces of the pair of adjacent leads are exposed prior to applying the radiant energy to create the carbonized surface.

8. The method of claim 7 and further including:
    ablating the cover layer using radiant energy.

9. The method of claim 7 and further including:
    removing the carbonized surface area.

10. The method of claim 9 wherein the step of removing the carbonized surface area includes applying a radiant energy of sufficient fluence and duration.

11. The method of claim 1 wherein the carbonizable material is a polymer and the radiant energy is a laser.

12. The method of claim 1 wherein the electronic component is a read/write head of a hard disk drive and the leads are a portion of the electrical interconnect leading to and from the read/write head.

13. The method of claim 1 wherein the leads include read leads extending to and from the read/write head of a hard disk drive, the read leads including a plurality of adjacent interleaved dead end leads, said method further including:
    applying the radiant energy to the surface area between the interleaved dead end leads.

14. The method of claim 1 wherein at least a pair of adjacent leads include at least in part a sinuous pattern and said method further includes:
    applying the radiant energy to the surface area between the at least a pair of adjacent leads where such leads form a sinuous pattern.

15. The method of claim 1 and further including:
    applying the radiant energy with a laser beam having a first fluence level to create the carbonized surface.

16. The method of claim 15 and further including directing the laser beam through a mask.

17. The method of claim 16 and further including directing the laser beam through filter.

18. The method of claim 17 and further including focusing the laser beam.

19. The method of claim 15 and further including ablating the carbonized surface with a laser beam to remove the shunt.

20. The method of claim 1 wherein the electronic component is a read/write head of a hard disk drive and the leads are a portion of the electrical interconnect leading to and from the read/write head and wherein said interconnect includes termination pads and test pads and said shunt is formed between said termination pads and said test pads.

21. The method of claim 1 wherein said carbonizable material is an adhesive disposed between at least a pair of adjacent leads.

22. A method for protecting an electronic component from damage caused by ESD/EOS, said component including a plurality of leads for conducting electric current supported at least in part on a substrate, said method comprising:
    applying radiant energy of sufficient fluence and duration to a predetermined area of the substrate to produce a carbonized surface area on the substrate between adjacent leads, the carbonized area providing a shunt between the leads.

23. The method of claim 22 and further including:
    removing the shunt.

24. The method of claim 23 wherein said step of removing the shunt includes applying radiant energy of sufficient fluence to ablate the carbonized surface area on the substrate.

25. The method of claim 22 wherein the radiant energy is provided by a laser beam.

26. The method of claim 25 wherein the radiant energy is ultraviolet laser light.

27. The method of claim 22 wherein said step of applying radiant energy includes providing a laser beam, reducing the fluence of the laser beam to a reduced fluence level, and applying said reduced fluence level laser beam to the substrate.

28. The method of claim 27 wherein the fluence level of the laser beam is reduced by passing the laser beam through a neutral density filter.

29. The method of claim 27 and further including:
removing the shunt by applying radiant energy to said shunt.

30. The method of claim 29 wherein said step of applying radiant energy to said shunt includes applying the full fluence of the laser beam to the substrate.

31. The method of claim 27 including passing the reduced fluence laser beam through a mask for sculpting the beam to a predetermined shape.

32. The method of claim 22 wherein said step of applying radiant energy includes providing a laser beam and passing the laser beam through a mask for sculpting the beam to a predetermined shape.

33. The method of claim 32 and further including:
removing the shunt by applying radiant energy to said shunt.

34. The method of claim 33 wherein said step of applying radiant energy to said shunt includes increasing the fluence of the laser beam by passing the laser beam through a focusing means prior to passing it through the mask and applying the increased fluence laser beam to the substrate.

35. The method of claim 22 wherein the electronic component is the read head of a hard disk drive and the shunt is applied to an electrical interconnect of the read head.

36. A method of protecting an electronic component from EDS/EOS, said component including a plurality of leads for conducting electric current supported at least in part on a substrate, said method comprising:
providing a plurality of resistors in parallel with the electronic component by applying radiant energy to produce a carbonized material.

37. The method of claim 36 wherein the electronic component is a read head of a hard disk drive.

38. The method of claim 37 wherein the leads of the read head include a lead extending to the read head and a lead returning from the read head and wherein said leads are intertwined on the substrate, wherein said step of providing a plurality of resistors in parallel comprises creating a shunt across the intertwined leads.

39. The method of claim 38 wherein the shunt is created by applying a radiant energy source to the substrate to produce a conductive surface layer on the substrate.

40. The method of claim 39 and further including:
removing the shunt.

41. The method of claim 40 wherein said step of removing the shunt includes applying radiant energy of sufficient fluence to ablate the carbonized surface area on the substrate.

42. The method of claim 39 wherein the radiant energy is provided by a laser beam.

43. The method of claim 42 wherein the radiant energy is ultraviolet laser light.

44. The method of claim 39 wherein said step of applying radiant energy includes providing a laser beam, reducing the fluence of the laser beam to a reduced fluence level, and applying said reduced fluence level laser beam to the substrate.

45. The method of claim 44 wherein the fluence level of the laser beam is reduced by passing the laser beam through a neutral density filter.

46. The method of claim 44 and further including:
removing the shunt by applying radiant energy to said shunt.

47. The method of claim 46 wherein said step of applying radiant energy to said shunt includes applying the full fluence of the laser beam to the substrate.

48. The method of claim 44 including passing the reduced fluence laser beam through a mask for sculpting the beam to a predetermined shape.

49. The method of claim 39 wherein said step of applying radiant energy to create the shunt includes providing a laser beam and passing the laser beam through a mask for sculpting the beam to a predetermined shape.

50. The method of claim 49 and further including:
removing the shunt by applying radiant energy to the shunt.

51. The method of claim 50 wherein said step of applying radiant energy to said shunt includes increasing the fluence of the laser beam by passing the laser beam through a focusing means prior to passing it through the mask and applying the increased fluence laser beam to the substrate.

52. The method of claim 36 wherein the leads include a lead extending to the electronic component and returning from the electronic component and wherein said leads are intertwined on the substrate, wherein said step of providing a plurality of resistors in parallel comprises creating a shunt across the intertwined leads.

53. The method of claim 52 wherein the shunt is created by applying a radiant energy source to the substrate to produce a conductive surface layer on the substrate.

54. The method of claim 53 and further including:
removing the shunt.

55. The method of claim 54 wherein said step of removing the shunt includes applying radiant energy of sufficient fluence to ablate the carbonized surface area on the substrate.

56. The method of claim 53 wherein the radiant energy is provided by a laser beam.

57. The method of claim 56 wherein the radiant energy is ultraviolet laser light.

58. The method of claim 39 wherein said step of applying radiant energy includes providing a laser beam, reducing the fluence of the laser beam to a reduced fluence level, and applying said reduced fluence level laser beam to the substrate.

59. The method of claim 58 wherein the fluence level of the laser beam is reduced by passing the laser beam through a neutral density filter.

60. The method of claim 58 and further including:
removing the shunt by applying radiant energy to said shunt.

61. The method of claim 60 wherein said step of applying radiant energy to remove the shunt includes applying the full fluence of the laser beam to the substrate.

62. The method of claim 61 including passing the reduced fluence laser beam through a mask for sculpting the beam to a predetermined shape.

63. The method of claim 39 wherein said step of applying radiant energy includes providing a laser beam and passing the laser beam through a mask for sculpting the beam to a predetermined shape.

64. The method of claim 63 and further including:
removing the shunt by applying radiant energy to said shunt.

65. The method of claim 64 wherein said step of applying radiant energy to said shunt includes increasing the fluence of the laser beam by passing the laser beam through a focusing means prior to passing it trough the mask and applying the increased fluence laser beam to the substrate.

* * * * *